US006458202B1

(12) United States Patent
Kojima et al.

(10) Patent No.: US 6,458,202 B1
(45) Date of Patent: Oct. 1, 2002

(54) PROCESS FOR PREPARING SINGLE CRYSTAL SILICON HAVING UNIFORM THERMAL HISTORY

(75) Inventors: Makoto Kojima, Tochigi-Prefecture; Yasuhiro Ishii, Tochigi, both of (JP)

(73) Assignee: MEMC Electronic Materials, Inc., St. Peters, MO (US)

(*) Notice: Subject to any disclaimer, the term of this patent is extended or adjusted under 35 U.S.C. 154(b) by 0 days.

(21) Appl. No.: 09/596,493

(22) Filed: Jun. 19, 2000

Related U.S. Application Data
(60) Provisional application No. 60/152,066, filed on Sep. 2, 1999.

(51) Int. Cl.[7] .............................................. C30B 15/14
(52) U.S. Cl. .............................. 117/13; 117/14; 117/15; 117/20; 117/30; 117/207; 117/932
(58) Field of Search ................................ 117/13, 14, 15, 117/20, 207, 30, 932

(56) References Cited

U.S. PATENT DOCUMENTS

| 5,152,867 A | 10/1992 | Kitaura et al. |
| 5,779,791 A | 7/1998 | Korb et al. ..................... 117/15 |
| 5,919,302 A | 7/1999 | Falster et al. |
| 5,954,873 A * | 9/1999 | Hourai et al. ................. 117/932 |
| 5,994,761 A | 11/1999 | Falster et al. ................ 257/611 |
| 6,284,039 B1 * | 9/2001 | Mule'Stagno et al. ......... 117/3 |
| 6,287,380 B1 * | 9/2001 | Falster ......................... 117/13 |

FOREIGN PATENT DOCUMENTS

| DE | 196 52 543 A1 | 6/1998 |
| EP | 0 503 816 A1 | 3/1992 |
| EP | 0 854 209 | 7/1998 |
| EP | 09 845 508 | 10/1998 |

* cited by examiner

Primary Examiner—Robert Kunemund
(74) Attorney, Agent, or Firm—Senniger, Powers, Leavitt & Roedel

(57) ABSTRACT

A Czochralski method of producing a single crystal silicon ingot having a uniform thermal history. In the process, the power supplied to the side heater is maintained substantially constant throughout the growth of the main body and end-cone of the ingot, while power supplied to a bottom heater is gradually increased during the growth of the second half of the main body and the end-cone. The present process enables an ingot to be obtained which yields wafers having fewer light point defects in excess of about 0.2 microns, while having improved gate oxide integrity.

26 Claims, 19 Drawing Sheets

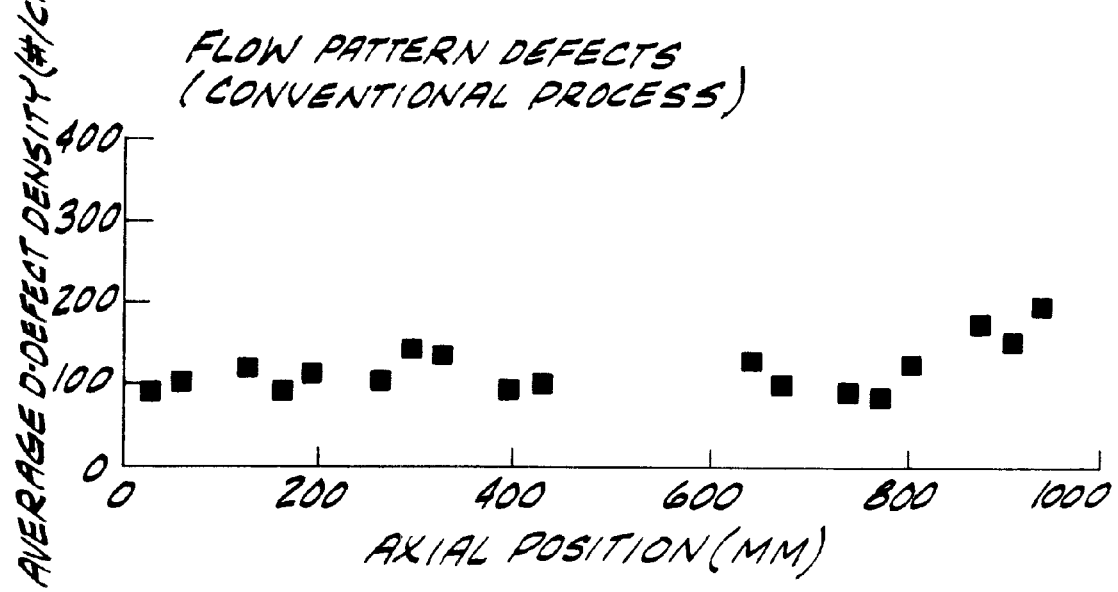

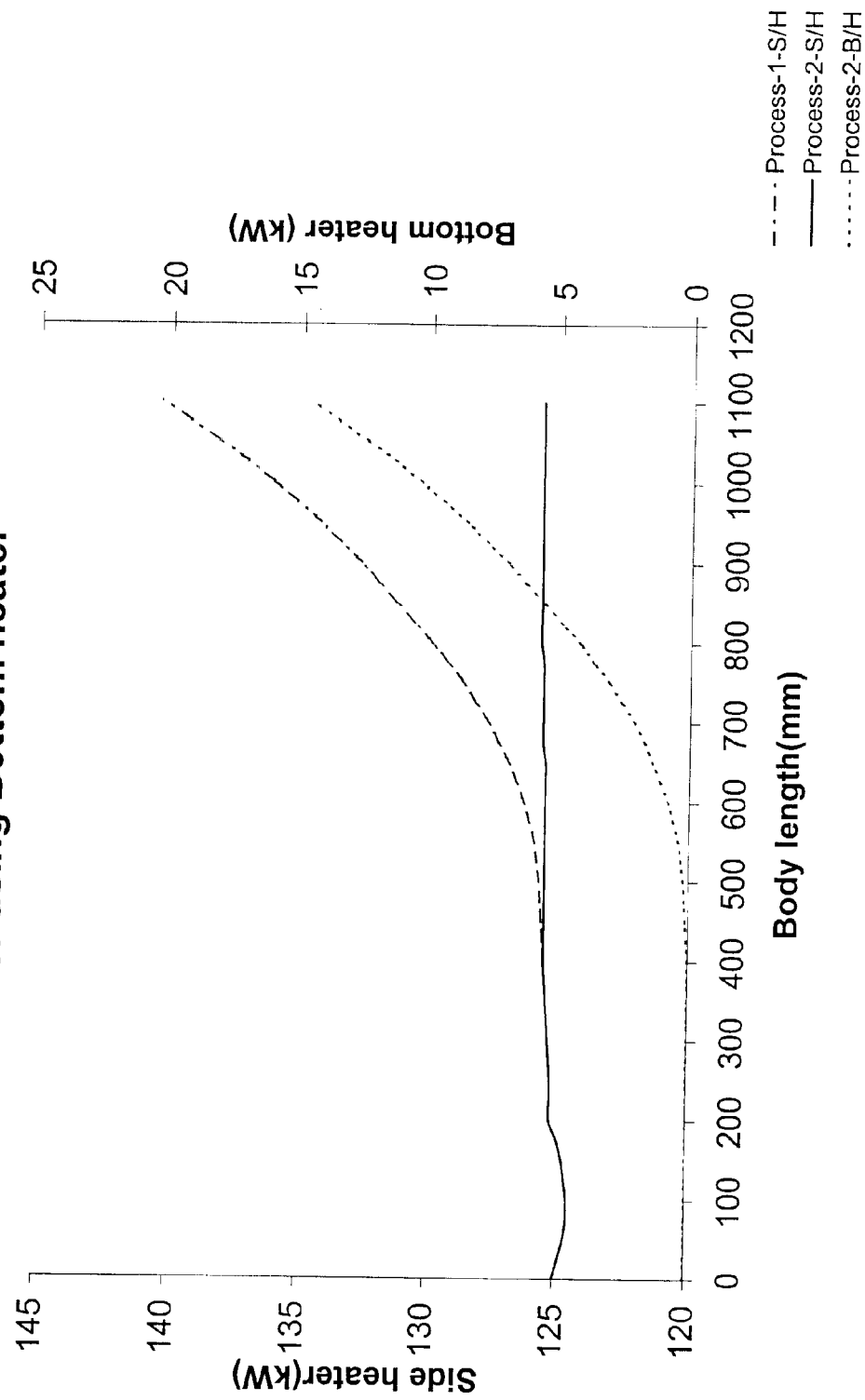

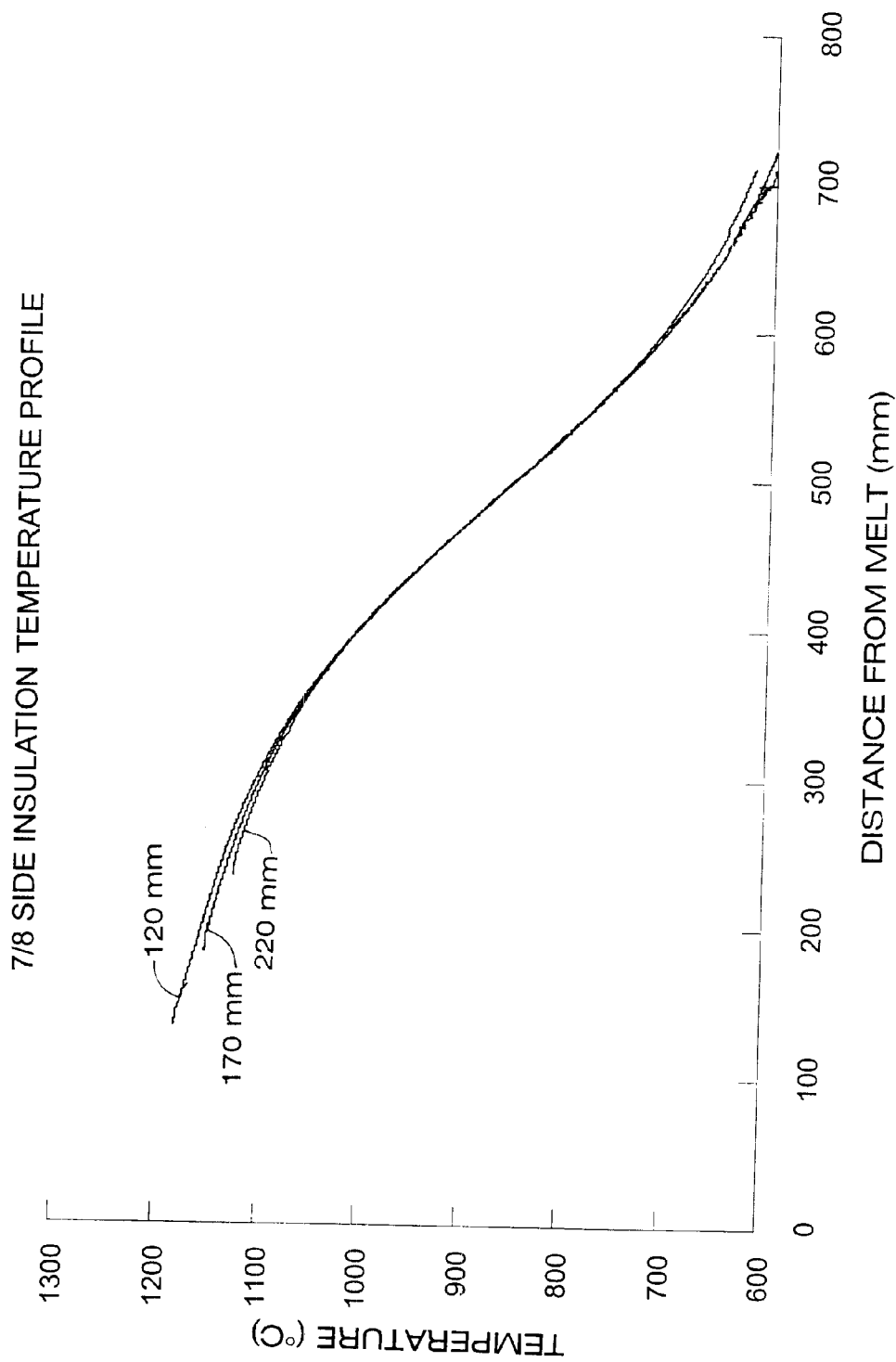

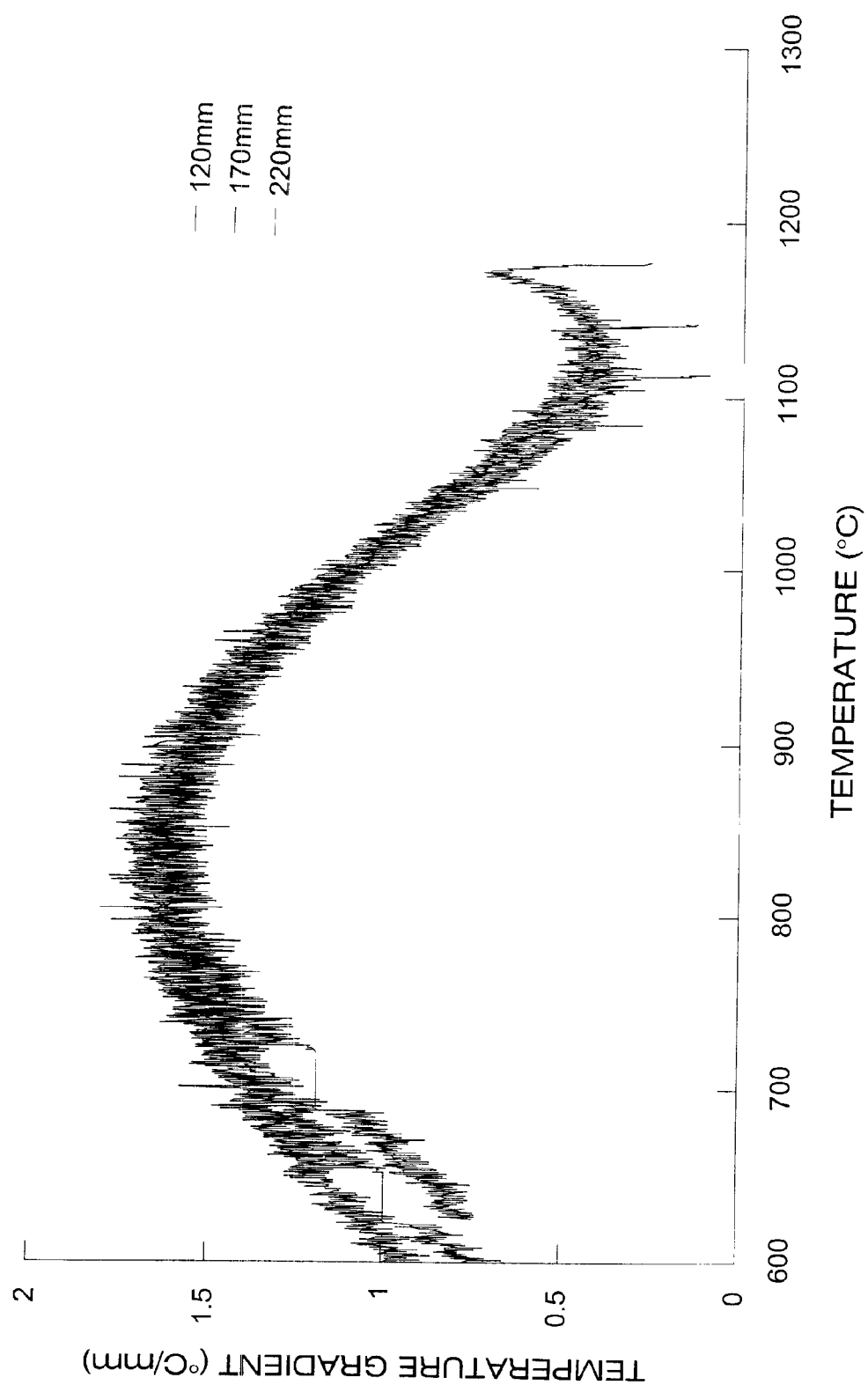

PROCESS FOR PREPARING SINGLE CRYSTAL SILICON HAVING UNIFORM THERMAL HISTORY

CROSS-REFERENCE TO RELATED APPLICATIONS

This application claims the benefit of U.S. Provisional Application No. 60/152,066, filed Sep. 2, 1999.

BACKGROUND OF THE INVENTION

In general, the present invention relates to the preparation of a single crystal silicon ingot according to the Czochralski method. In particular, the invention relates to a process for controlling the thermal history of the ingot as it is grown in order to limit the density and size of vacancy-related agglomerated defects in, and improve the gate oxide integrity of, wafers obtained therefrom.

Single crystal silicon, which is the starting material in most processes for the fabrication of semiconductor electronic components, is commonly prepared by the so-called Czochralski ("Cz") method. In this method, polycrystalline silicon ("polysilicon") is charged to a crucible and melted, a seed crystal is brought into contact with the molten silicon and a single crystal is grown by slow extraction. After formation of a neck is complete, the diameter of the crystal is enlarged by decreasing the pulling rate and/or the melt temperature until the desired or target diameter is reached. The cylindrical main body of the crystal which has an approximately constant diameter is then grown by controlling the pull rate and the melt temperature while compensating for the decreasing melt level. Near the end of the growth process but before the crucible is emptied of molten silicon, the crystal diameter must be reduced gradually to form an end-cone. Typically, the end-cone is formed by increasing the crystal pull rate and heat supplied to the crucible. When the diameter becomes small enough, the crystal is then separated from the melt.

In recent years, it has been recognized that a number of defects in single crystal silicon form in the growth chamber as the ingot cools from the temperature of solidification. More specifically, as the ingot cools intrinsic point defects, such as crystal lattice vacancies or silicon self-interstitials, remain soluble in the silicon lattice until some threshold temperature is reached, below which the given concentration of intrinsic point defects becomes critically supersaturated. Upon cooling to below this threshold temperature, a reaction or agglomeration event occurs, resulting in the formation of agglomerated intrinsic point defects.

It has previously been reported (see, e.g., PCT/US98/07365 and PCT/US98/07304) that the type and initial concentration of these point defects in the silicon are determined as the ingot cools from the temperature of solidification (i.e., about 1410° C.) to a temperature greater than about 1300° C. (i.e., about 1325° C., 1350° C. or more). That is, the type and initial concentration of these defects are controlled by the ratio $v/G_0$, where v is the growth velocity and $G_0$ is the average axial temperature gradient over this temperature range. Specifically, for increasing values of $v/G_0$, a transition from decreasingly self-interstitial dominated growth to increasingly vacancy dominated growth occurs near a critical value of $v/G_0$ which, based upon currently available information, appears to be about $2.1 \times 10^{-5}$ cm$^2$/sK, where $G_0$ is determined under conditions in which the axial temperature gradient is constant within the temperature range defined above. Accordingly, process conditions, such as growth rate and cooling rate (which affect v), as well as hot zone configurations (which affect $G_0$), can be controlled to determine whether the intrinsic point defects within the single crystal silicon will be predominantly vacancies (where $v/G_0$ is generally greater than the critical value) or self-interstitials (where $v/G_0$ is generally less than the critical value).

Defects associated with the agglomeration of crystal lattice vacancies, or vacancy intrinsic point defects, include such observable crystal defects as D-defects, Flow Pattern Defects (FPDs), Gate Oxide Integrity (GOI) Defects, Crystal Originated Particle (COP) Defects, and crystal originated Light Point Defects (LPDs), as well as certain classes of bulk defects observed by infrared light scattering techniques (such as Scanning Infrared Microscopy and Laser Scanning Tomography). Also present in regions of excess vacancies are defects which act as the nuclei for the formation of oxidation induced stacking faults (OISF). It is speculated that this particular defect is a high temperature nucleated oxygen agglomerate catalyzed by the presence of excess vacancies.

Once the "agglomeration threshold" is reached, intrinsic point defects, such as vacancies, continue to diffuse through the silicon lattice as long as the temperature of that portion of the ingot remains above a second threshold temperature (i.e., a "diffusivity threshold"), below which intrinsic point defects are no longer mobile for commercially practical periods of time. While the ingot remains above this temperature, vacancy intrinsic point defects diffuse through the crystal lattice to sites where agglomerated vacancy defects are already present, effectively causing a given agglomerated defect to grow in size. These agglomerated defect sites essentially act as "sinks," attracting and collecting vacancy intrinsic point defects, because of the more favorable energy state of the agglomeration.

Accordingly, the formation and size of such agglomerated vacancy defects are dependent upon the thermal history, and more specifically the cooling rate or residence time, of the main body of the ingot over the range of temperatures from the "agglomeration threshold" to the "diffusivity threshold." For example, high cooling rates typically result in the silicon ingot having a large number of agglomerated vacancy defects which are relatively small in diameter. Such conditions are favorable, for example, with respect to light point defects (LPDs) because integrated circuit manufactures typically require that the number of such defects in excess of about 0.2 microns in size not exceed about 20 for a 200 mm diameter wafer. However, such conditions are unfavorable because they typically yield wafers having an unacceptable gate oxide integrity (GOI); that is, such conditions result in wafers having a large number of small agglomerated vacancy defects which negatively impact gate oxide integrity. In contrast, slow cooling rates typically result in the ingot having a few very large agglomerated vacancy defects, thus yielding wafers with acceptable GOI values but unacceptable LPD results.

The problems associated with agglomerated vacancy defects are further complicated by the fact that the cooling rate of the ingot is often not uniform over the length of the main body. As a result, the size and concentration of defects in the wafers obtained from such an ingot will not be the same. This variation in the wafers obtained from a single ingot creates problems for those who have proposed to remove such agglomerated defects subsequent to their formation. More specifically, some have proposed to annihilate defects formed in ingots grown at a high pull rate by heat treating the silicon in wafer form. For example, Fusegawa et al. propose, in European Patent Application 503,816 A1, growing the silicon ingot at a growth rate in excess of 0.8 mm/minute, and heat treating the wafers which are sliced from the ingot at a temperature in the range of 1150° C. to 1280° C. to annihilate the defects which form during the crystal growth process. Such heat treatments have been shown to reduce the defect density in a thin region near the wafer surface. However, the specific conditions needed will vary depending upon, among other things, the concentration and location of the defects. For example, such heat treatments may successfully dissolve agglomerated vacancy defects in wafers obtain from portions of the ingot near the seed-cone but not in wafers obtained from portions of the ingot near the end-cone. Accordingly, treating wafers obtained from ingots having a nonuniform axial thermal history, and thus a nonuniform axial concentration of agglomerated defects, requires different processing conditions. As a result, such wafer heat treatments are uneconomical. Furthermore, these treatments have the potential for introducing metallic impurities into the silicon wafers.

The nonuniform thermal history of a given ingot may be due, for example, to conditions associated with growth of the main body or the end-cone of the ingot. More specifically, often the cooling rate for the latter portion of the main body and the end-cone differs from that of the earlier portion of the main body given that, typically, (i) side heater power is increased after as little as 20% of the main body has been grown, and (ii) side heater power and growth rate are increased during growth of the end-cone of the ingot. Side heater power is typically increased during the growth of the main body because, as the level of the melt decreases, additional heat is needed in order to ensure the polysilicon remains in a molten state; that is, side heater power is typically increased as the polysilicon melt is depleted to ensure that it does not re-solidify or "freeze." Side heater power and/or growth rate are typically increased during end-cone growth to cause a decrease in ingot diameter.

Accordingly, a need continues to exist for a process which enables a single crystal silicon ingot to be grown in such a way that the main body of the ingot has a relatively uniform thermal history, a thermal history that enables wafers to be obtained which meet LPD requirements and have optimum GOI values.

SUMMARY OF THE INVENTION

Among the several objects and features of the present invention is the provision of a process for controlling the thermal history of a single crystal silicon ingot; the provision of such a process wherein the cooling rate of the main body of the ingot is relatively uniform; the provision of such a process wherein the side heater power of the crystal puller remains substantially constant during growth of the main body and the end-cone of the ingot; the provision of such a process wherein the concentration of agglomerated vacancy defects in the ingot is relatively uniform over the length of the main body; the provision of such a process wherein the size of such agglomerated defects in the silicon, in wafer form, is minimized; the provision of such a process wherein the gate oxide integrity of the silicon, in wafer form, is improved; the provision of such a process which does not require high temperature heat treatments, or does not require differing high temperature heat treatments, of the silicon in wafer form; the provision of such a process which does not materially reduce throughput by reducing the pull rate during the growth of the main body of the ingot; and, the provision of such a process wherein the axial temperature gradient of the ingot in the crystal puller, at temperatures above which intrinsic point defects remain mobile, is controlled to improve uniformity of the thermal history of the main body of. the ingot.

Briefly, therefore, the present invention is directed to a process for controlling the thermal history of a single crystal silicon ingot during growth, the silicon ingot being pulled from a silicon melt in accordance with the Czochralski method, the ingot having, in succession, a seed-cone, a main body, and an end-cone. the process comprises controlling (i) a growth velocity, v, and (ii) an average axial temperature gradient, $G_0$, during the growth of the main body of the ingot over the temperature range from solidification to a temperature of no less than about 1325° C., such that vacancies are the predominant intrinsic point defect in the main body, and heating the silicon melt during growth of the main body with a side heater and a bottom heater, the side heater being maintained at a substantially constant power level during growth of the main body and end-cone.

The present invention is further directed to a process for preparing a single crystal silicon ingot, from which may be obtained single crystal silicon wafers having gate oxide integrity values of at least about 50% and fewer than about 20 light point defects in excess of about 0.2 microns in size. The single crystal silicon ingot is pulled from a silicon melt in accordance with the Czochralski method, wherein the growth velocity, v, and an average axial temperature gradient, $G_0$, are controlled during growth over the temperature range from solidification to a temperature of no less than about 1325° C., such that vacancies are the predominant intrinsic point defect therein. The ingot has, in succession, a seed-cone, a main body, and an end-cone. The process is characterized in that, during growth of the main body and end-cone, side heater power remains substantially constant while heat is applied from below the silicon melt using a bottom heater in order to prevent the melt from re-solidifying.

Other objects and features of the present invention will be in part apparent and in part pointed out hereinafter.

BRIEF DESCRIPTION OF THE DRAWINGS

FIG. 2 is a graph showing the density of flow pattern defects, as well as axial variations therein, throughout the main body of the ingot, grown in a conventional manner using an "open" type hot zone configuration.

FIG. 3 is a graph showing the power supplied to a side heater element and a bottom heater element, both as a function of body length, when pulling a single crystal silicon ingot in the conventional manner and in accordance with the process of the present invention.

FIG. 7 is a graph of the axial temperature profile of the second half of a single crystal silicon ingot (i.e., from an axial position of about 400 mm to about 850 mm) as a function of distance from the melt surface in a "slow cool" type Czochralski growth apparatus having seven-eighths the full thickness of side insulation.

FIG. 8 is a graph of the axial temperature gradient of the second half of a single crystal silicon ingot (i.e., from an axial position of about 400 mm to about 850 mm) as a function of temperature in a "slow cool") type Czochralski growth apparatus having seven-eighths the full thickness of side insulation.

FIGS. 9a through 9e representing consecutive 20% portions of the ingots from which the wafers were obtained, the single crystal silicon ingots having been grown in a "slow cool" hot zone configuration wherein a bottom heater is not employed and side heater power is increased during the growth process.

FIGS. 10a through 10e representing consecutive 20% portions of the ingots from which the wafers were obtained, the single crystal silicon ingots having been grown in a "slow cool" hot zone configuration wherein a bottom heater is employed and side heater power remains constant during the growth process.

DETAILED DESCRIPTION OF THE PREFERRED EMBODIMENTS

The process of the present invention advantageously provides the means by which to grow a Czochralski-type single crystal silicon ingot, and preferably an ingot having silicon lattice vacancies as the predominant intrinsic point defect, wherein the thermal history is substantially uniform over the entire main body of the ingot. More specifically, in accordance with the present process, growth conditions are controlled such that any given segment of the main body of the ingot cools at about the same rate as the other segments of the main body, between the agglomeration threshold temperature and the diffusivity threshold temperature. Stated another way, growth conditions are controlled such that any given segment resides between the agglomeration threshold temperature and the diffusivity threshold temperature for about the same period of time as the other segments of the main body. Accordingly, in contrast to conventional processes, wherein side heater power is increased during growth of the main body and the end-cone, the thermal history of the main body of the ingot in the present process is controlled, at least in part, by maintaining the power supplied to the side heater at a substantially constant level while heat is supplied from a bottom heater (i.e., a heater positioned within the crystal puller below the crucible which holds the silicon melt).

It is to be noted that the term "substantially constant," as used herein in reference to side heater power, is to be understood to mean a variation of typically less than about 10%, 5%, or even 2%.

Figure 1A:
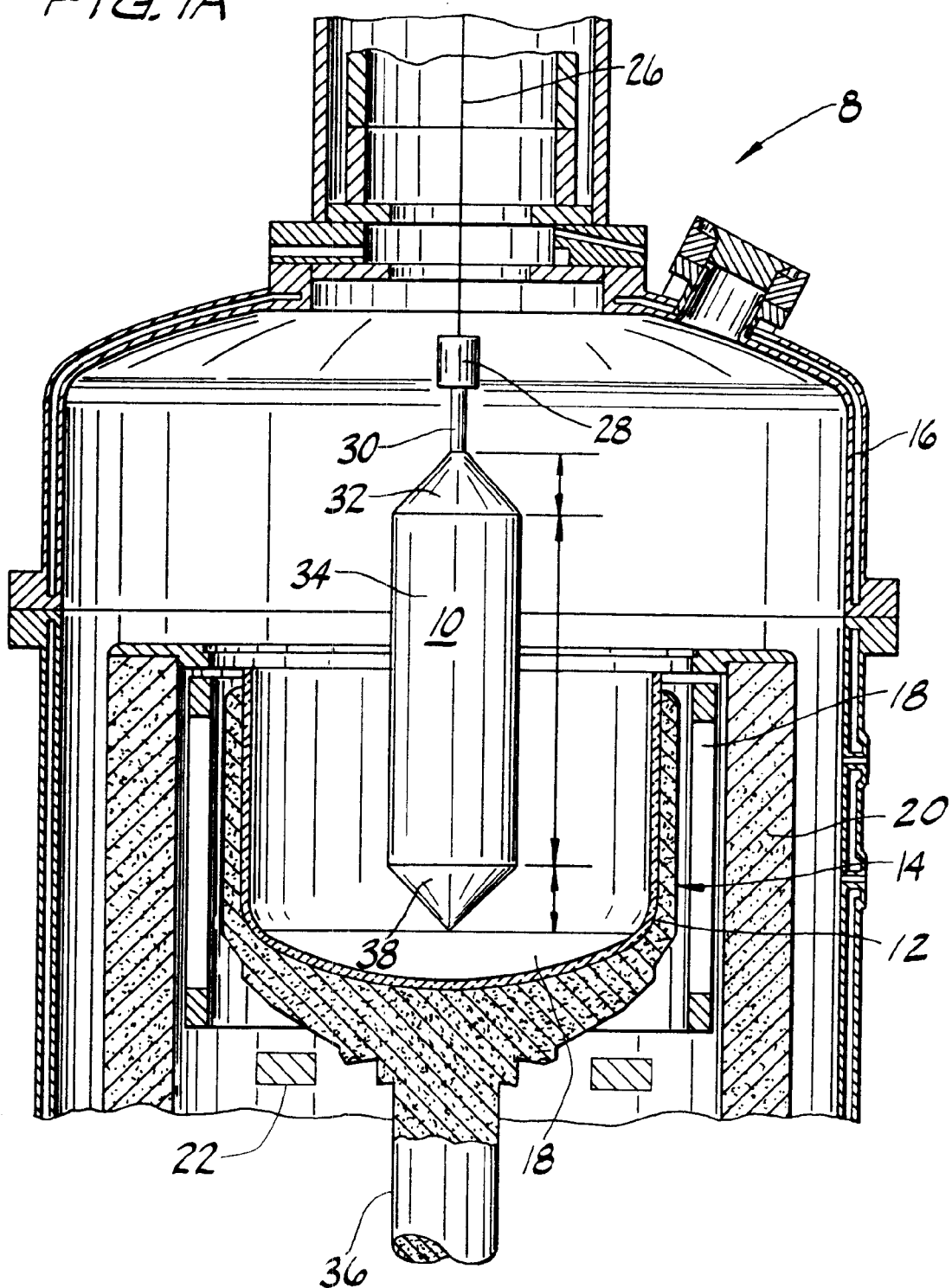
FIG. 1A is a sectional view of a Czochralski growth apparatus in accordance with an embodiment of the present invention.
Figure 1B:
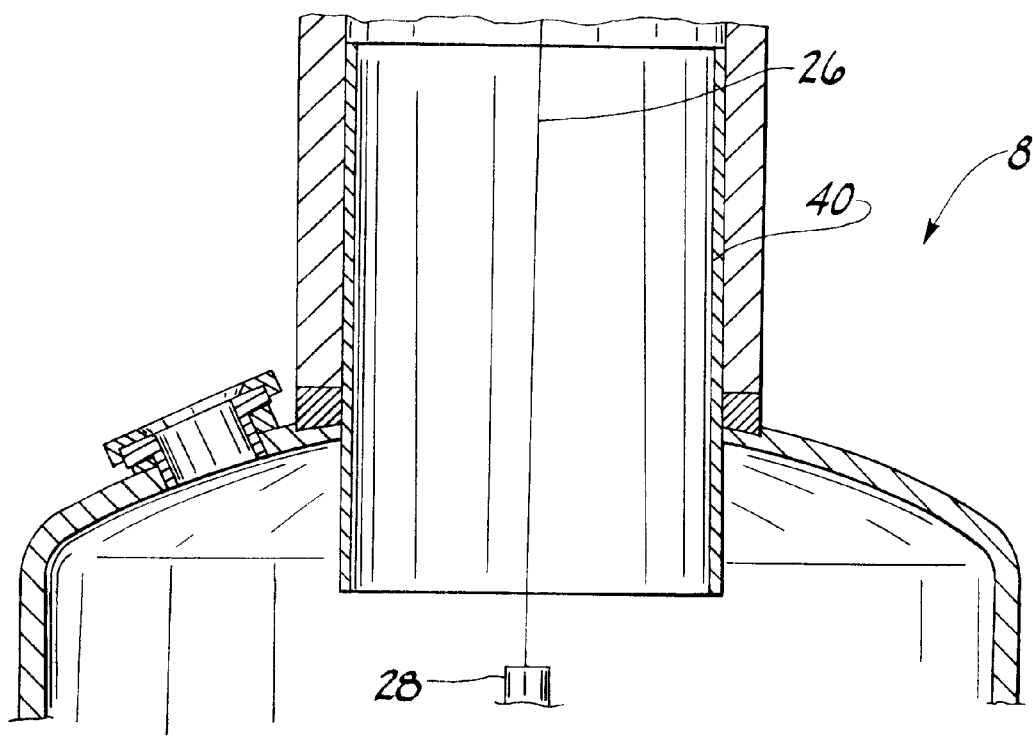
FIG. 1B is a sectional view of a portion of a Czochralski growth apparatus, wherein an example of a "slow cool" hot zone is depicted (the apparatus 40 generally representing insulation, shields/reflectors or heaters which may be extended from the pull chamber and over the melt to slow the rate at which the growing ingot cools).

Referring now to FIGS. 1A and 1B, there is shown an example of a crystal pulling apparatus 8 suitable for producing Czochralski-type single crystal silicon ingot 10, in accordance with the present process. The crystal pulling apparatus 8 includes a fused silica crucible 12 surrounded by a graphite susceptor 14 and contained within a water-cooled stainless steel growth chamber 16, the growth chamber defining a space, or "hot zone," wherein ingot growth occurs. The crucible 12 holds a silicon melt 18, provided by adding solid polycrystalline silicon or "polysilicon" (not shown), to the crucible 12. The polysilicon is melted by heat provided from a side heater 20 which surrounds the crucible 12. Optionally, melting of the polysilicon may be further aided by the use of a bottom heater 22 positioned beneath the crucible 12. The side heater 20 is surrounded by insulation 24 to help retain the heat within the crucible. A pulling shaft or wire 26 supporting a monocrystalline silicon seed 28 at its lower end is positioned above the silicon melt 18.

Generally speaking, during the Czochralski process, the seed crystal 28 is lowered until it contacts the surface of the molten silicon 18 and begins to melt. After thermal equilibration, the pulling wire 26 is then retracted to withdraw the seed 28 from the silicon melt 18. As the seed 28 is withdrawn, the liquid silicon from the melt 18 solidifies around the seed in a single crystal above the melt. The pulling wire 26 from which the formed single crystal is suspended is continuously retracted from the melt 18 as it rotates, forming a substantially cylindrical neck region 30. After the neck of the ingot is formed, the pull rate is decreased, creating an outwardly flaring region 32 typically referred to as the seed-cone of the ingot. When the desired diameter is obtained, growth conditions are controlled to provide a substantially continuous diameter for a main body 34 of the ingot 10.

While the ingot 10 is being pulled, the crucible 12 is rotated via a shaft 36 in a direction opposite that of the ingot. As the ingot 10 grows, the crucible 12 is raised within the growth chamber 16 to compensate for the depletion of the silicon melt 18. In a conventional growth process, side heater power is typically increased after about 20% to about 50% of the main body 34 of the ingot 10 has been grown, depending upon the particular configuration of the hot zone of the crystal puller, in order to maintain the temperature of the melt and ensure the melt remains in a molten state. When the melt is nearly depleted, again in a conventional process, the side heater power, the pull rate, or both are increased in order to decrease the diameter of the ingot 10, resulting in the formation of a conical end-cone 38. Once the diameter of the end-cone 38 is sufficiently small, generally 2 mm to 4 mm, detachment of the ingot 10 from the silicon melt 18 can be accomplished without causing dislocations to spread to the main body 34 of the ingot. The ingot 10 is then removed from the growth chamber 14 and processed to form silicon wafers.

Typically, each solidified segment of the growing ingot cools as it is lifted up and away from the silicon melt and crucible, resulting in a temperature gradient over the length of the main body of the ingot. For example, a solidified segment of the main body just above the melt/solid interface has a temperature of about 1400° C., while each previously solidified segment of the ingot has a correspondingly lower temperature. The precise degree to which each segment has cooled, however, is at least in part a function of (i) pull rate, (ii) heater power and (iii) hot zone design (i.e., the presence and position of, for example, reflectors, radiation shields, purge tubes, light pipes, and secondary heaters, all generally represented in FIG. 1B at 40). More specifically, it is to be noted that while each solidified segment typically has a temperature which is lower than the subsequent segment, growth conditions and/or hot zone designs may be controlled to alter this result.

As an example of the foregoing, the temperature gradient of a 200 mm nominal diameter ingot grown under conventional process conditions (i.e., a process wherein side heat power increases during the growth of the main body and both side heater power and pull rate are increased during end-cone growth) in a standard "open" hot zone design (i.e., a hot zone having no reflectors, radiation shields, purge tubes, light pipes, or secondary heaters present above the melt to slow the rate at which the growing ingot would otherwise cool) immediately after being detached from the silicon melt will range from about 1400° C. near the tip of the end-cone to less than about 750° C. near the seed-cone. Furthermore, due to the increased pull rate and the ingot becoming detached from the melt, which causes the ingot to lose the benefit of conductive heat received therefrom, the latter portion of the main body of the ingot and the seed-cone cool more quickly than the earlier portion of the main body.

Referring now to FIG. 2, the difference in the cooling rate for various segments of the ingot can affect, among other things, the size and distribution of agglomerated defects, such as flow patter defects or light point defects, over the length of the ingot (see, e.g., the defect density at an axial position of about 900 mm, relative to the density of previously solidified and cooled segments). Stated another way, due to the differences in cooling rates for segments of an ingot, the latter portion of the ingot will typically yield wafers having higher densities of small light point defects or flow pattern defects, and thus poorer GOI values, as compared to wafers obtained from the earlier portion of the ingot.

As previously noted, hot zone design may affect the rate at which a growing ingot cools within the crystal puller and, as a result, the size and distribution of defects that would otherwise be obtained. For example, in contrast to the expected results from a standard "open" hot zone, if the above-described process were performed in a "slow cooling" hot zone (i.e., a hot zone having reflectors, radiation shields, purge tubes, light pipes, secondary heaters, or a combination thereof, present above the melt, as generally indicated in FIG. 1B at 40, to limit the temperature profile of the growing ingot, typically to about 2° C./mm, about 1° C./mm or less), the increase in side heater power actually results in a decrease in the axial temperature profile of the latter portion of the ingot, causing this portion to cool at a slower rate than that of the earlier portion. This effect is obtained even if the growth rate is increased during formation of the end-cone.

Referring now to FIGS. 9a through 9e, generally depicted are the results of a number of wafers which have been analyzed, by means common in the art, for the presence of LPDs greater than about 0.2 microns in size. Specifically, a number of wafers were obtained from ingots prepared in a "slow cool" hot zone, wherein side heater power was increased after about 50% of the main body of each ingot was grown. As can be seen from these results (where FIGS. 9a through 9e represent wafers obtained from consecutive 20% portions of the main bodies of the ingots), this increase in side heater power eventually impacts the number of large LPDs formed. In particular, it is to be noted that, of the wafers obtained from the first 40% of the main bodies of the ingots (see FIGS. 9a and 9b), only about 5 had an unacceptable number of LPDs in excess of about 0.2 microns (i.e., greater than about 20 LPDs). In contrast, of the wafers obtained from the next 40% of the main bodies of the same ingots (see FIGS. 9c and 9d), about 8 wafers were unacceptable. Most significantly, however, is the fact that more than 25 of the wafers obtained from the final 20% portion of the same ingots (see FIG. 9e) were unacceptable.

Without being held to any particular theory, it is generally believed that the materials added to the hot zone to limit the thermal profile absorbs the additional heat being produced by the side heater as the power is increased and then radiates this heat toward the adjacent portion of the main body of the ingot. As a result, the cooling rate of this portion of the main body, as well as the remaining portions of the main body to be grown, decreases. Stated another way, the "residence time" of these portions of the main body within the critical temperature range (i.e., the temperature range having as an upper boundary the "agglomeration threshold" temperature and as a lower boundary the "diffusivity threshold" temperature) increases. Wafers obtained from this portion of the ingot will therefore have lower densities of smaller agglomerated defects and higher numbers of larger defects, relative to wafers obtained from an earlier portion of the main body of the ingot.

As previously noted, manufacturers of highly integrated circuits impose stringent limits upon silicon wafers, in terms of the number and size of agglomerated defects, and thus GOI, which are acceptable. In view of the foregoing, it can be seen that preferably some balance is maintained during growth of the main body of the ingot to ensure these limits are met over the length of the ingot. More specifically, preferably growth conditions are maintained to ensure that any given segment of the main body of the ingot cools sufficiently fast, such that any given wafer obtained therefrom will not exceed the imposed limit on the number of LPDs larger than about 0.2 microns in size, while not being allowed to cool too fast, such that the same wafer does not contain too many small LPDs, and thus have an unacceptable GOI value.

Generally speaking, the process of the present invention advantageously provides the means by which to grow a Czochralski-type single crystal silicon ingot wherein the thermal history is substantially uniform over the entire main body of the ingot. In accordance with the present process, the thermal history of the ingot is controlled above the threshold temperature at which intrinsic point defects are mobile (i.e., the "diffusivity threshold," which is typically about 800° C., 900° C., 950° C. or even 1050° C.), such that substantially the entire main body of the ingot cools at about the same rate or, alternatively, that substantially the entire main body resides above this temperature for about the same amount of time. In contrast to conventional processes, wherein side heater power is increased during growth of the main body and the end-cone, the cooling rate or residence time is controlled in the present process, at least in part, by maintaining the power supplied to the side heater at a substantially constant level during the growth of both the main body and the end-cone.

Maintaining a generally constant level of side heater power while growing a single crystal silicon ingot is accomplished by applying heat to the silicon melt by means of a bottom heater (i.e., a heater positioned within the growth chamber below the crucible and silicon melt) and, more specifically, by increasing the power supplied to this bottom heater during both the growth of the latter portion of the main body and end-cone. Generally speaking, while side heater power remains substantially constant, heat is applied to the melt by means of the bottom heater during growth of the main body at the same point in the process at which side heater power would otherwise be increased. For example, standard growth processes in a conventional "open" hot zone typically involve the increase in side heater power after about 20% to about 30% or more of the main body has been grown. In contrast, bottom heating will typically begin in a "slow cool" hot zone after about 40%, 50%, 60% or more of the main body has been grown. Accordingly, it is to be noted that the precise point at which bottom heating begins is at least in part a function of the design of the hot zone being utilized and, as a result, may vary from one crystal puller to the next.

Referring now to FIGS. 10a through 10e, generally depicted are the results of a number of wafers, analyzed by means common in the art for the detection of LPDs, which were obtained from ingots prepared in a "slow cool" hot zone, wherein side heater power remained constant while power was supplied to the bottom heater after about 50% of the main bodies of the ingots were grown. As can be seen from these results (where FIGS. 10a through 10e represent wafers obtained from consecutive 20% portions of the main bodies of the ingots), in comparison to the corresponding results presented in FIGS. 9a through 9e, maintaining a constant side heater power significantly reduced the number of wafers that were obtained which contained large LPDs. Specifically, it may be observed that less than about 2 wafers were found to be unacceptable in the second 40% of the main bodies of the ingots, while only about 2 wafers were found to be unacceptable in the final 20%.

The precise values for the power supplied to the side and bottom heating elements during the growth of the main body of the single crystal silicon ingot may vary depending upon, among other things, the design of the hot zone and the size of the polysilicon charge. Typically, however, the power supplied to the side heater during the growth of substantially the entire main body (i.e., about 80%, 90%, 95% or more) and the end-cone in a "slow cool" hot zone configuration is maintained between about 100 and about 150 kW, preferably between about 120 kW and about 130 kW, and most preferably between about 124 and about 126 kW. In contrast, for the same or similar hot zone, the power supplied to the bottom heater during the growth of about the first half of the main body (i.e., between about 40% and 60% of the main body) is maintained between about 0 and about 5 kW, and preferably between about 0 and about 3 kW, while the power supplied to the bottom heater during the growth of the remainder of the main body and the end-cone is typically increased slowly from the initial value to a value less than about 30 kW, preferably less than about 25 , kW and more preferably less than about 20 kW, and most preferably less than about 15 kW.

With regard to the manner by which the bottom heater power is increased, it is to be noted that in some embodiments the power is increased along a quadratic curve, as exemplified in FIG. 3, while in other embodiments the power is typically increased by about 0.01 to about 0.1 kW/mm, preferably by about 0.01 to about 0.05 kW/mm, and most preferably by about 0.02 to about 0.03 kW/mm.

A more uniform thermal history enables a silicon ingot to be obtained having a more uniform distribution of agglomerated vacancy defects over the length of the main body; that is, by controlling the manner in which the main body of the ingot cools between the temperature at which agglomerated defects begin to form and the temperature at which vacancies are no longer sufficiently mobile for a commercially practical period of time, a more uniform distribution of FPDs is obtained. More specifically, side heater power is maintained at a substantially constant level while heat is applied to the melt from beneath the crucible in order to allow the main body of the growing ingot to cool at essentially the same rate over the temperature range from about 900° C. and about 1150° C., and preferably from about 1000° C. and 1100° C. Stated another way, defect uniformity is increased if each segment of the main body is allowed to reside within the noted temperature range for about the same amount of time.

In view of the foregoing, the process of the present invention utilizes a substantially constant side heater power throughout the growth of the main body and end-cone of the ingot, while applying heat to the silicon melt using a bottom heater. Generally speaking, the bottom heater is utilized as necessary to ensure the polysilicon charge remains molten throughout the process. More specifically, heat is applied to the melt in a "slow cool" type of hot zone after about 40%, 50%, 60% or more of the main body has formed, to ensure that the latter portion of the main body cools at about the same rate as the previously solidified portion. Accordingly, the cooling rate for a given segment of the main body is controlled such that it varies by less than about 50% relative to the other segments, with variations of less than about 35%, 20% and 10% being even more preferred. Most preferably, however, the cooling rate for a given segment of the main body, relative to the other segments of the main body, will vary by less than about 5%.

Referring now to FIGS. 5 through 8, according to the process of the present invention, a substantially constant side heater power is utilized in conjunction with the application of heat from beneath the crucible and silicon melt in order to typically maintain the axial temperature gradient of the main body of the ingot at less than about 2° C./mm. Preferably, however, the axial temperature gradient does not exceed about 1.5° C./mm, more preferably about 1° C./mm, and most preferably about 0.5° C./mm.

The thermal history of the main body of the ingot may be further controlled by maintaining a relatively constant pull rate throughout the growth of the main body and end-cone while, if necessary, adjusting the ingot and crucible rotation rates. In the present process, the average pull rates for the ingot during growth of the main body, both the first half and second half, are substantially similar to the average pull rate for the end-cone. Accordingly, typically the average pull rates for the first half of the main body, the second half of the main body and the end-cone do not vary by more than about 50%. Preferably, however, the average pull rates for first half, second half and end-cone do not vary by more than about 35%, more preferably about 20%, and still more preferably about 10%. Most preferably, however, the average pull rates for the first half and second half of the main body and the end-cone do not vary by more than about 5%.

The pull rate, during the growth of the main body and end-cone, typically ranges between about 0.4 mm/minute to about 1.25 mm/minute. More specifically, the average pull rates for the first half of the main body, the second half of the main body and the end-cone preferably range between about 0.45 mm/minute to about 0.75 mm/minute, and more preferably between about 0.45 mm/minute to about 0.65 mm/minute. It is to be noted, however, that pull rate is at least in part a function of ingot diameter; accordingly, for ingot diameters in excess of about 200 mm, the pull rate will typically be correspondingly lower.

In a preferred embodiment, the present process is carried out in a "slow cool" type of hot zone and the bottom heater is utilized, in conjunction with a constant side heater power and pull rate control, to ensure that the latter portion of the main body (i.e., about the last 60%, 50% or less) cools at a rate of less than about 2° C./minute, preferably less than about 1.5° C./minute, more preferably less than about 1° C./minute, and most preferably less than about 0.5° C./minute. Stated another way, a bottom heater is employed in conjunction with control of the pull rate and side heater power to ensure substantially the entire main body of the ingot resides between about 900° C. and about 1150° C., and preferably between about 1000° C. and 1100° C., for at least about 25 minutes, preferably at least about 50 minutes, and more preferably at least about 75 minutes, while in some instances times of at least about 100 minutes, 150 minutes or more may be preferred. However, it is to be noted that preferably this "residence time" is sufficiently long to obtain a relatively high GOI value, while not exceeding a duration which would result in an unacceptable number of LPDs in excess of about 0.2 microns. Accordingly, therefore, typically a given ingot segment will not reside within this temperature range for more than about 250 minutes.

It is to be noted, however, that absolute values of cooling rates and residence times will vary depending upon the hot zone design, the ingot diameter and the pull rate, among other things. Accordingly, for purposes of defect uniformity, absolute values are therefore not critical to the present process; rather, the relative differences for any given segment between the absolute values for cool rates and residence times are the important considerations.

Figure 4:
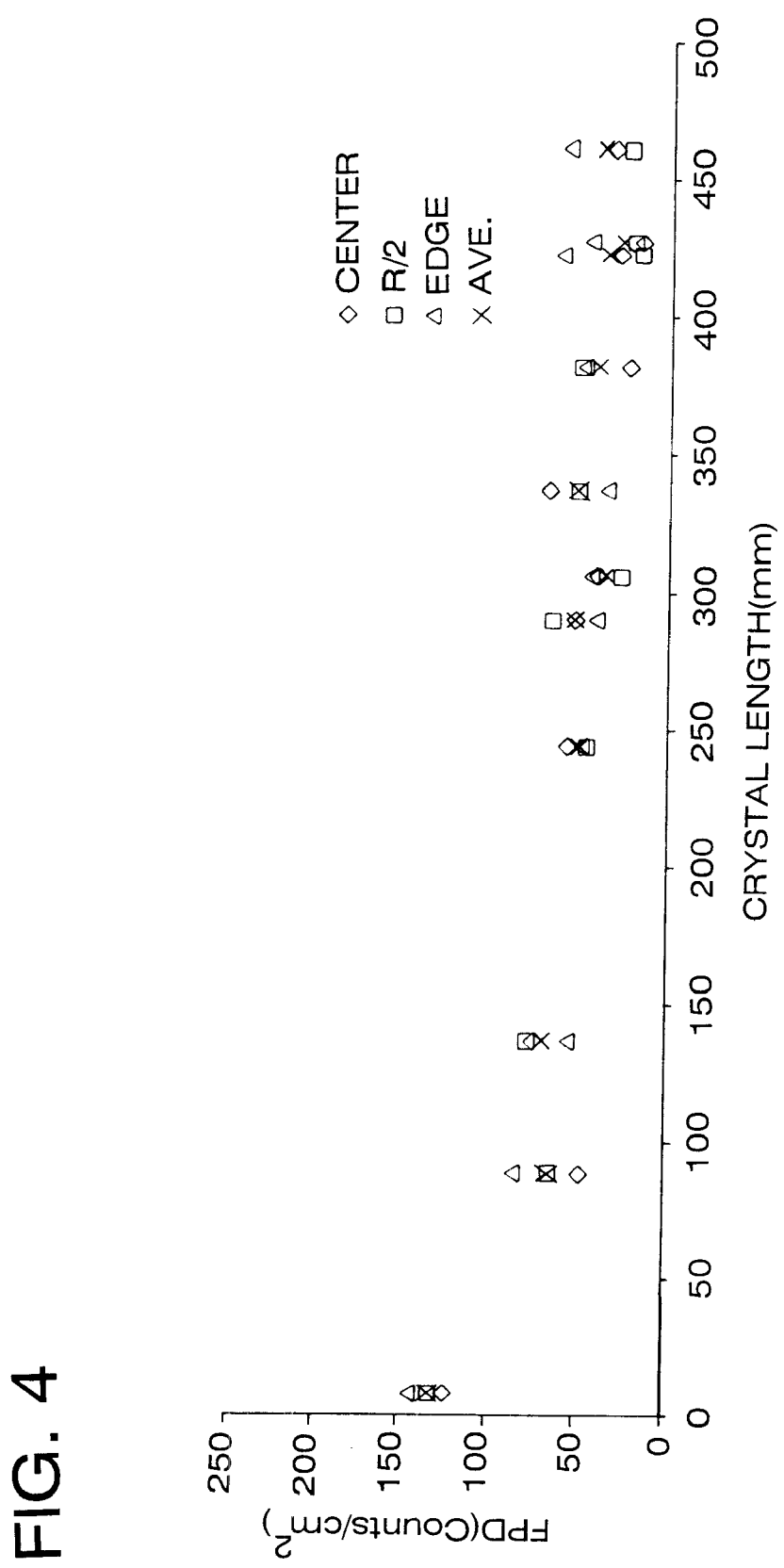
FIG. 4 is a graph showing the density of flow pattern defects and axial variations in density throughout the main body of the ingot, grown in accordance with the present process using a "slow cool" hot zone, configured by means common in the art.
Figure 5:
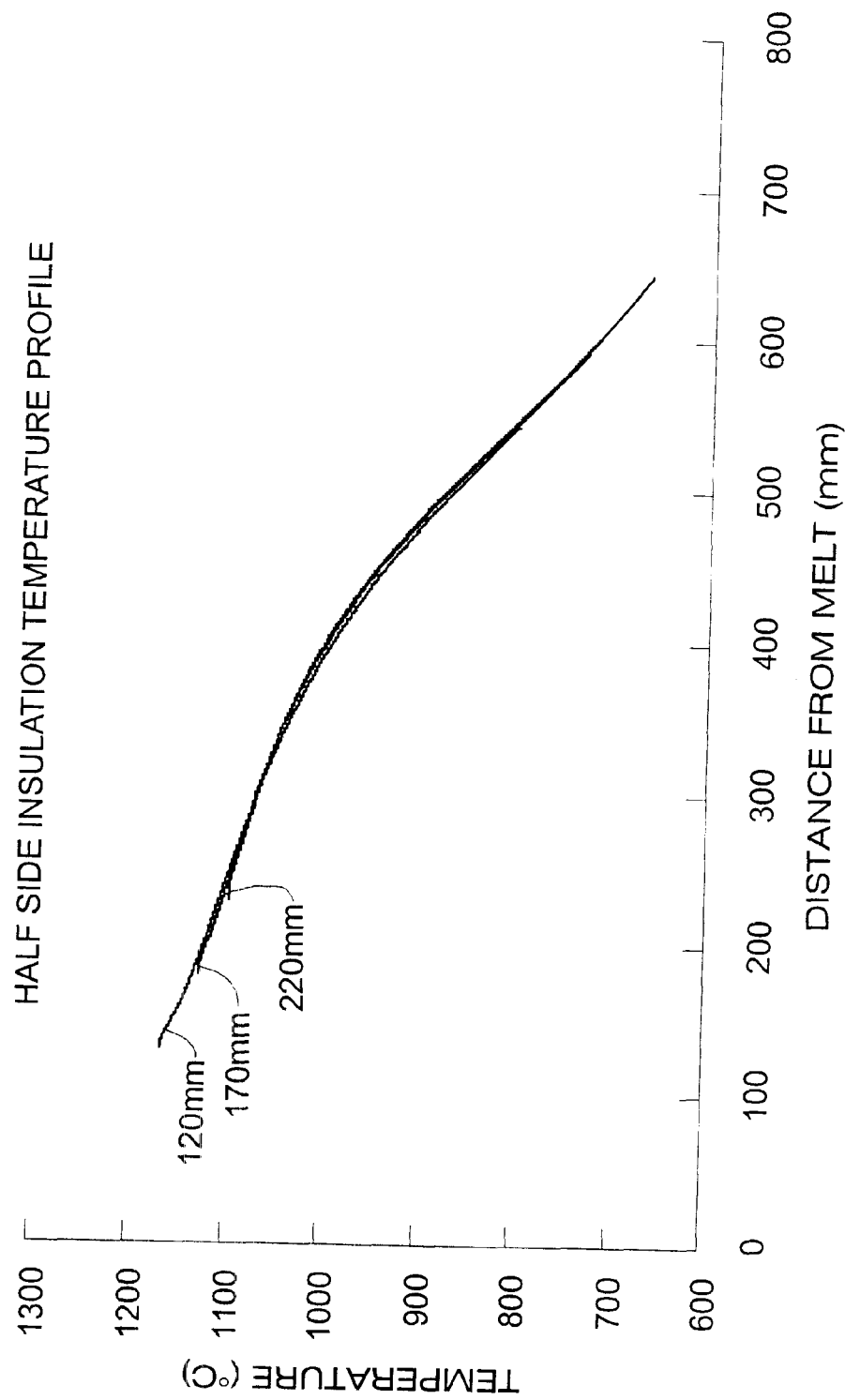
FIG. 5 is a graph of the axial temperature profile of the second half of a single crystal silicon ingot (i.e., from an axial position of about 400 mm to about 850 mm) as a function of distance from the melt surface in a "slow cool" type Czochralski growth apparatus having half the full thickness of side insulation.
Figure 6:
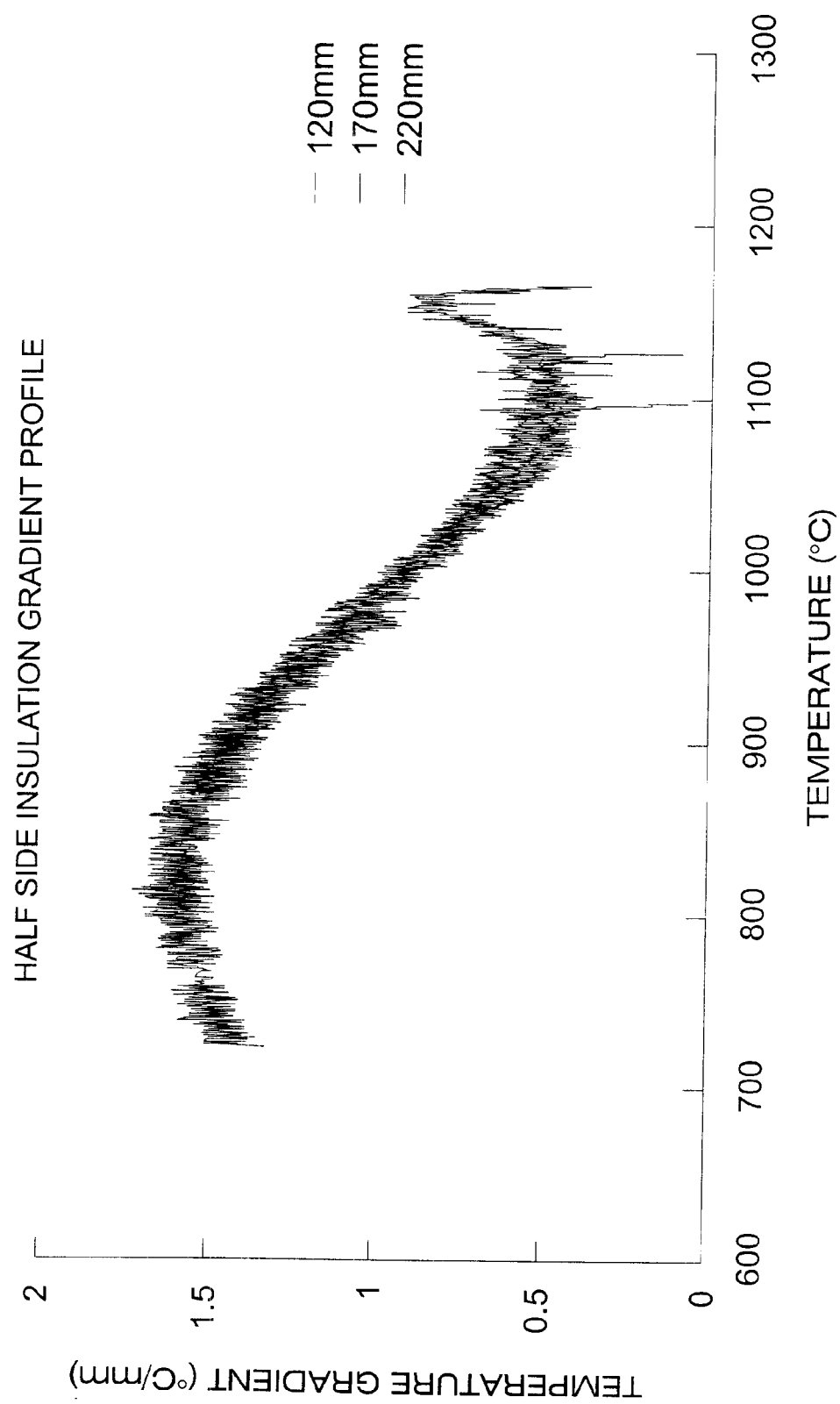
FIG. 6 is a graph of the axial temperature gradient of the second half of a single crystal silicon ingot (i.e., from an axial position of about 400 mm to about 850 mm) as a function of temperature in a "slow cool" type Czochralski growth apparatus having half the full thickness of side insulation.
Figure 9A:
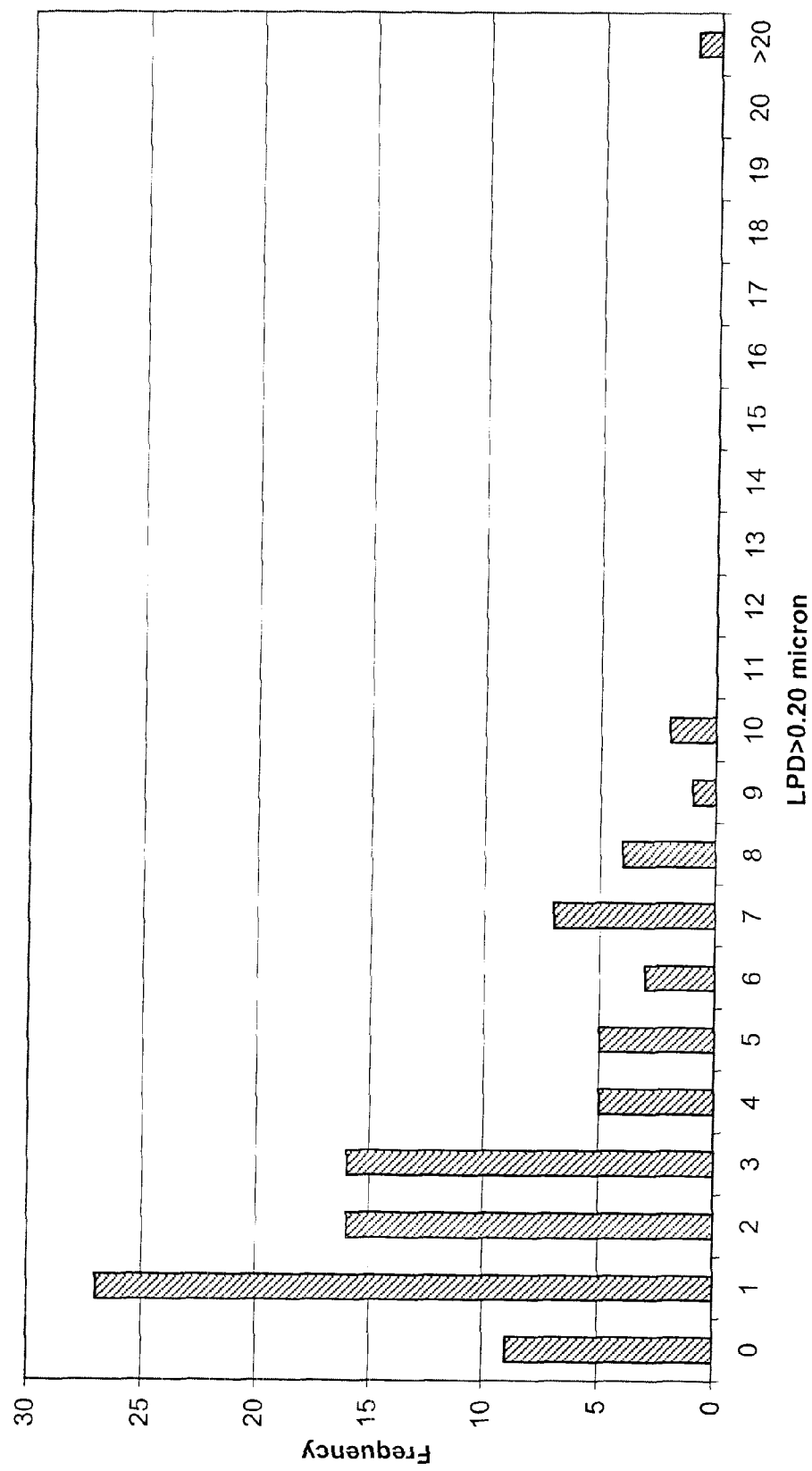
FIGS. 9a through 9e are histograms wherein a number of wafers were analyzed for the presence of light point defects in excess of about 0.2 microns (Y axis=number of wafers; X axis=number of LPDs in excess of about 0.2 microns)
Figure 9B:
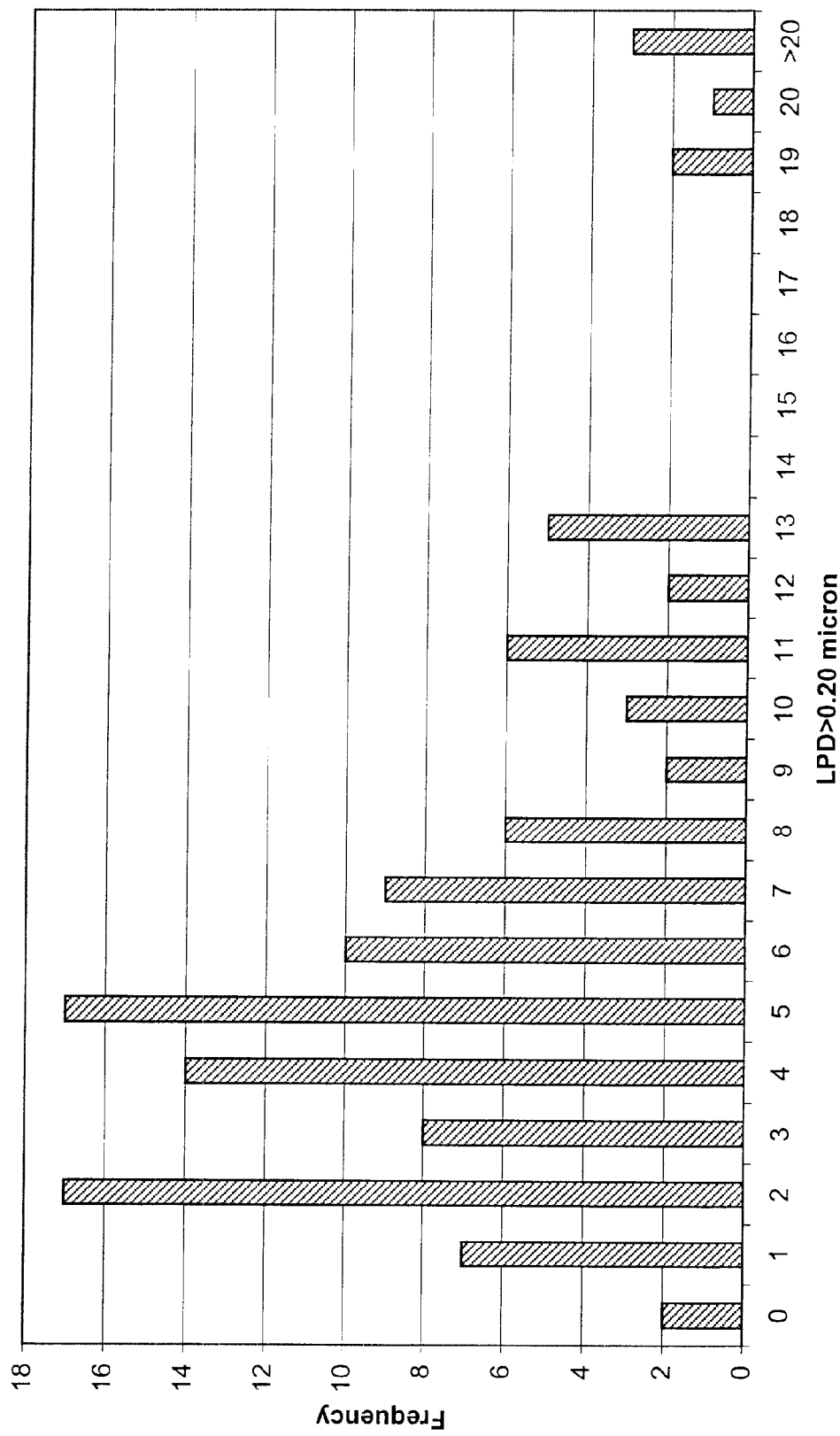
Figure 9C:
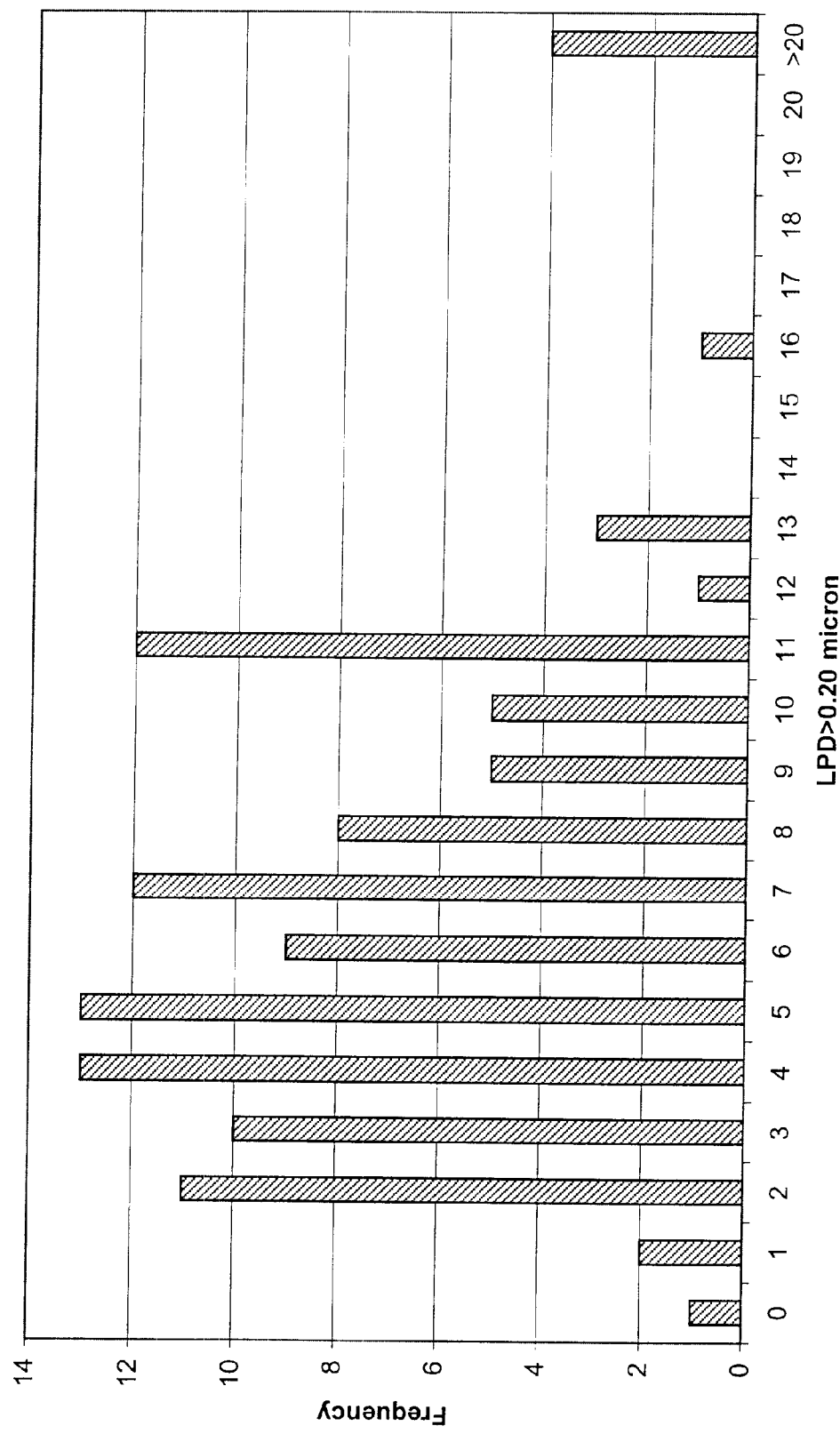
Figure 9D:
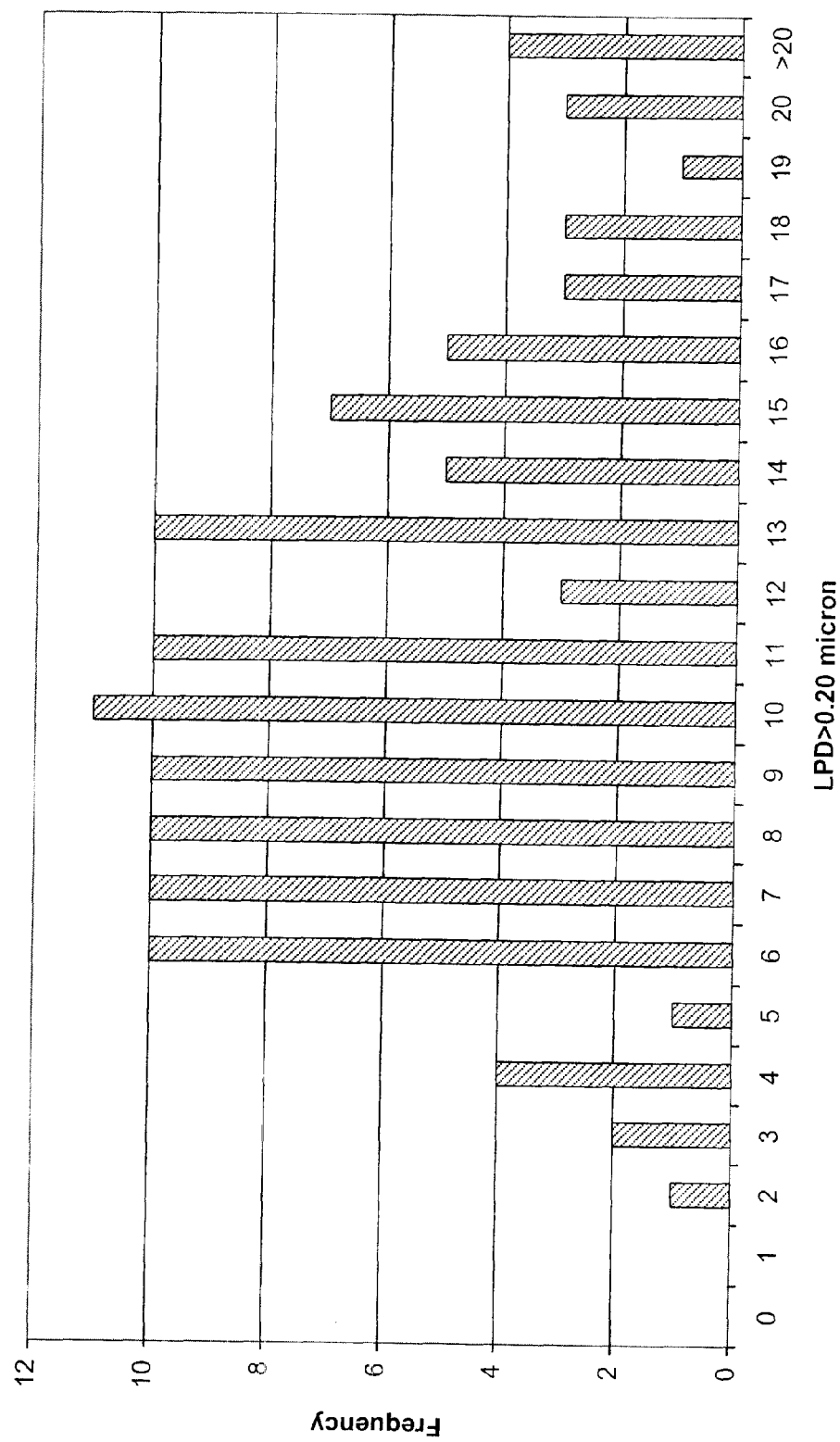
Figure 9E:
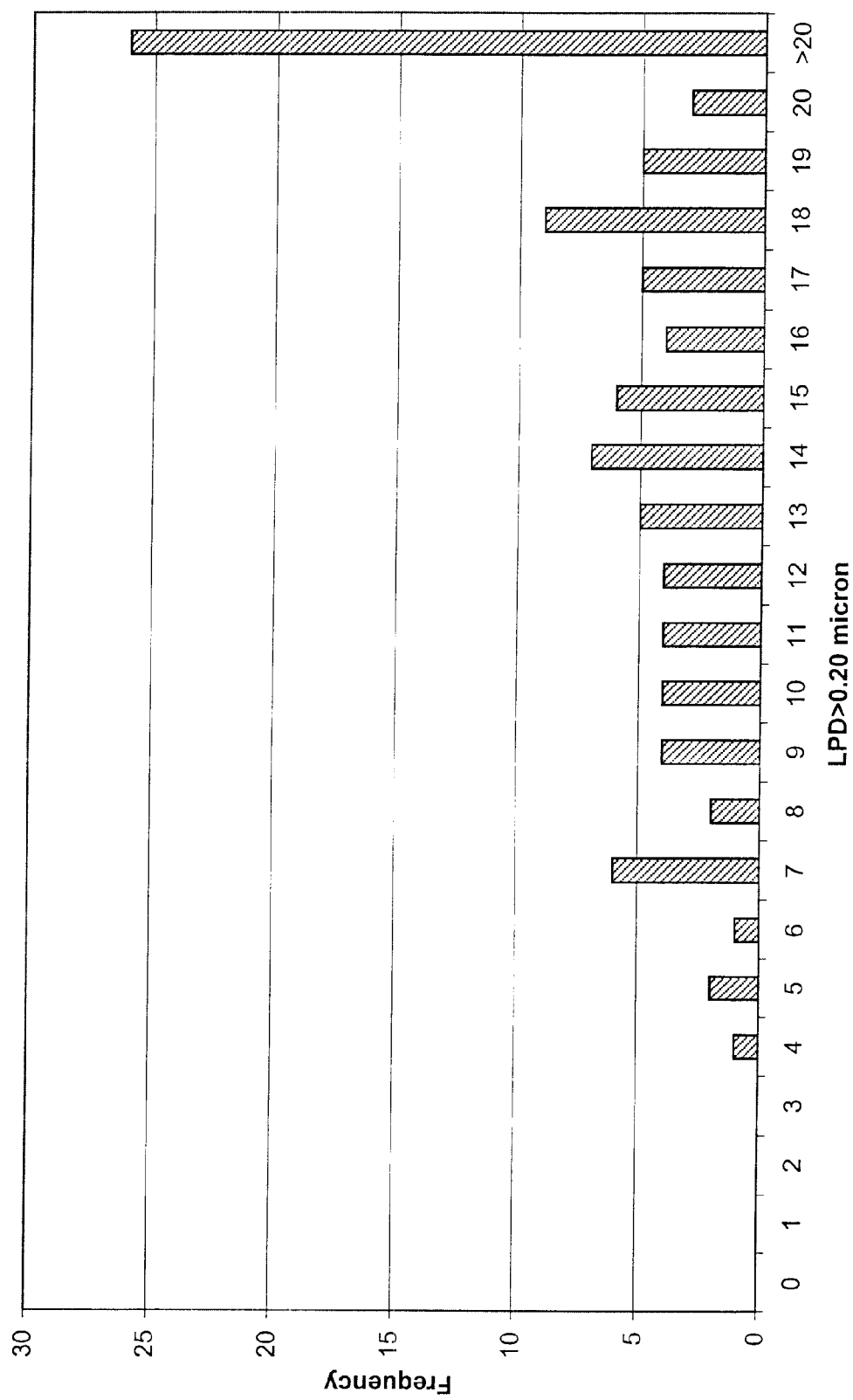
Figure 10A:
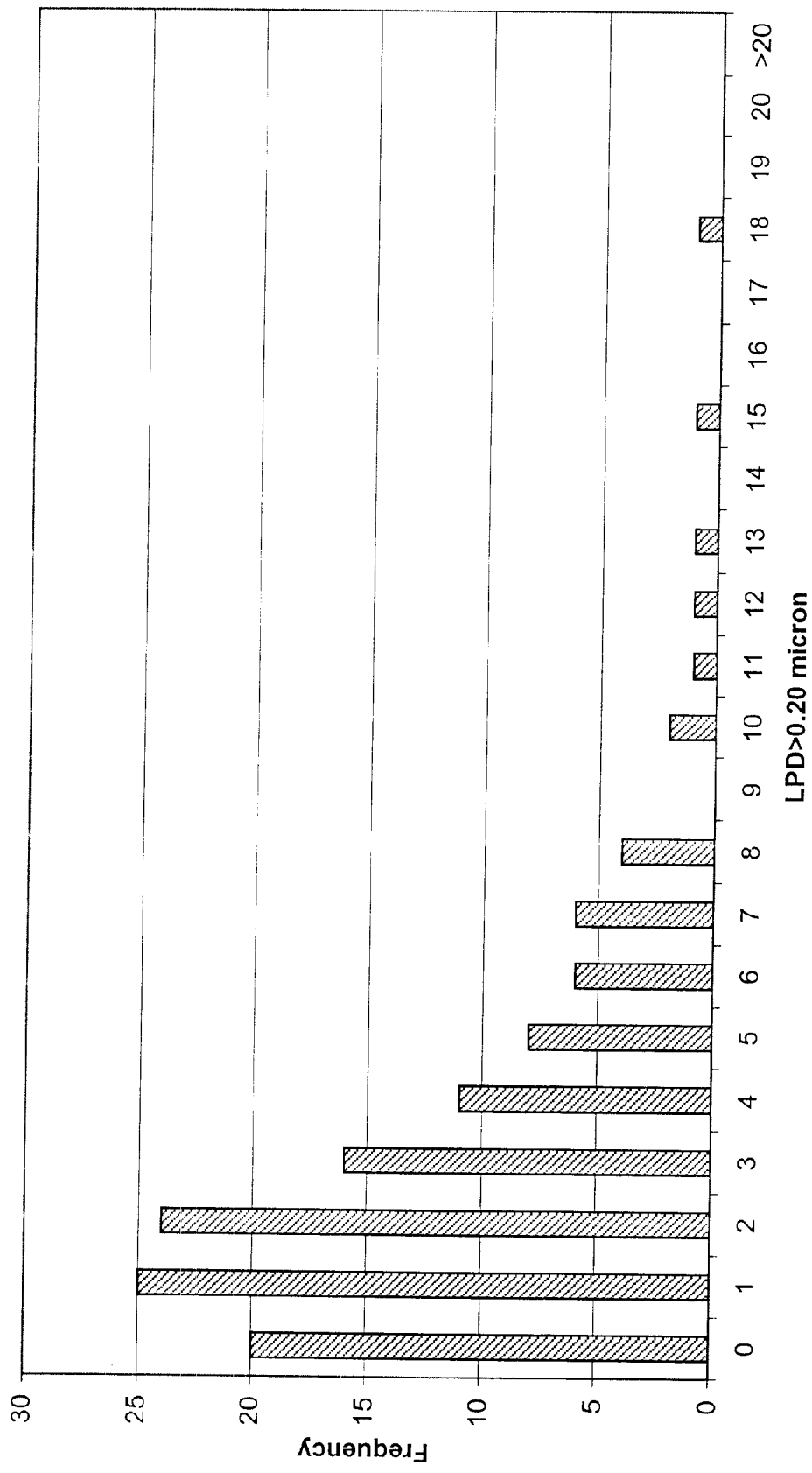
FIGS. 10a through 10e are histograms wherein a number of wafers were analyzed for the presence of light point defects in excess of about 0.2 microns (Y axis=number of wafers; X axis=number of LPDs in excess of about 0.2 microns)
Figure 10B:
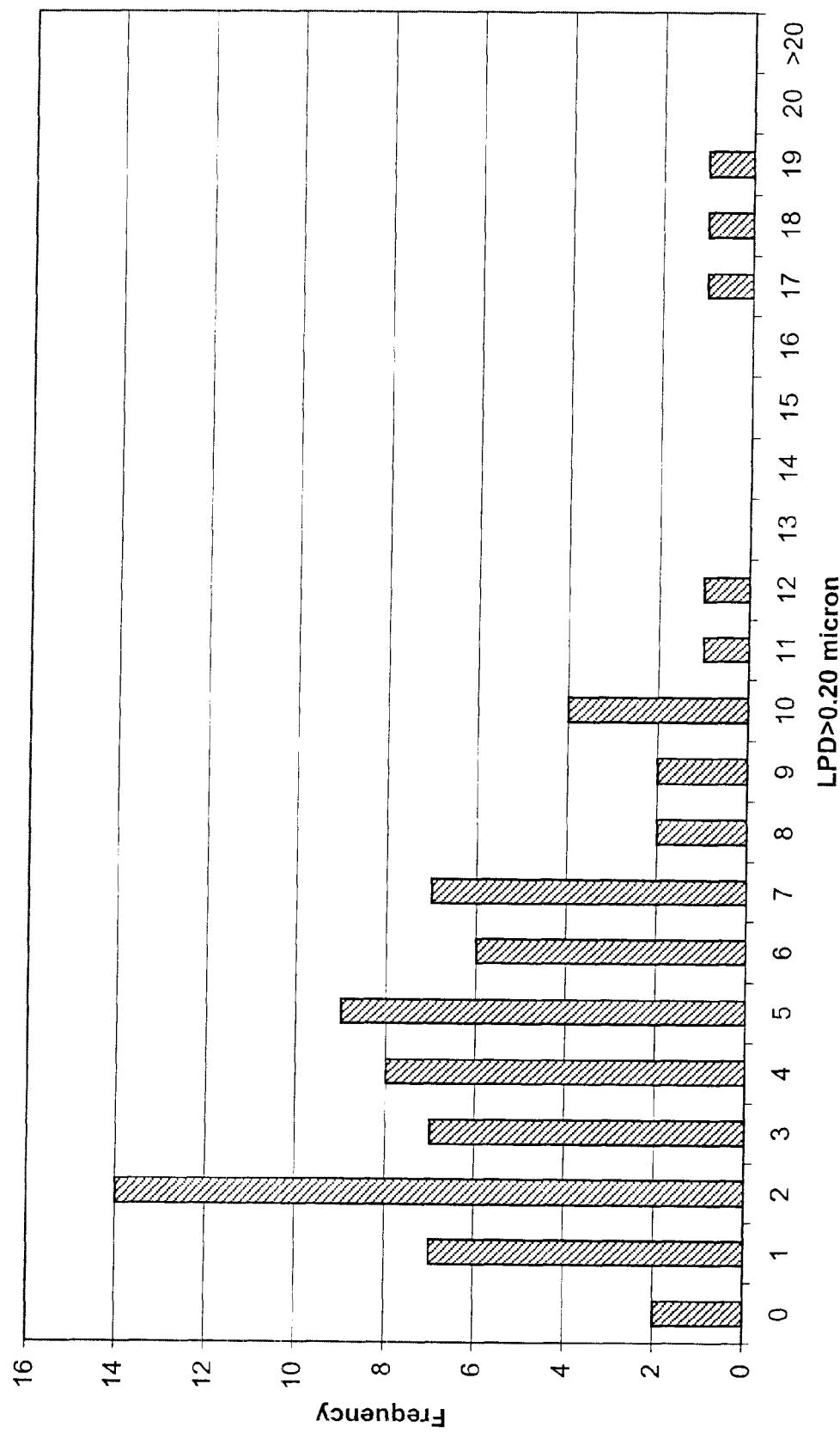
Figure 10C:
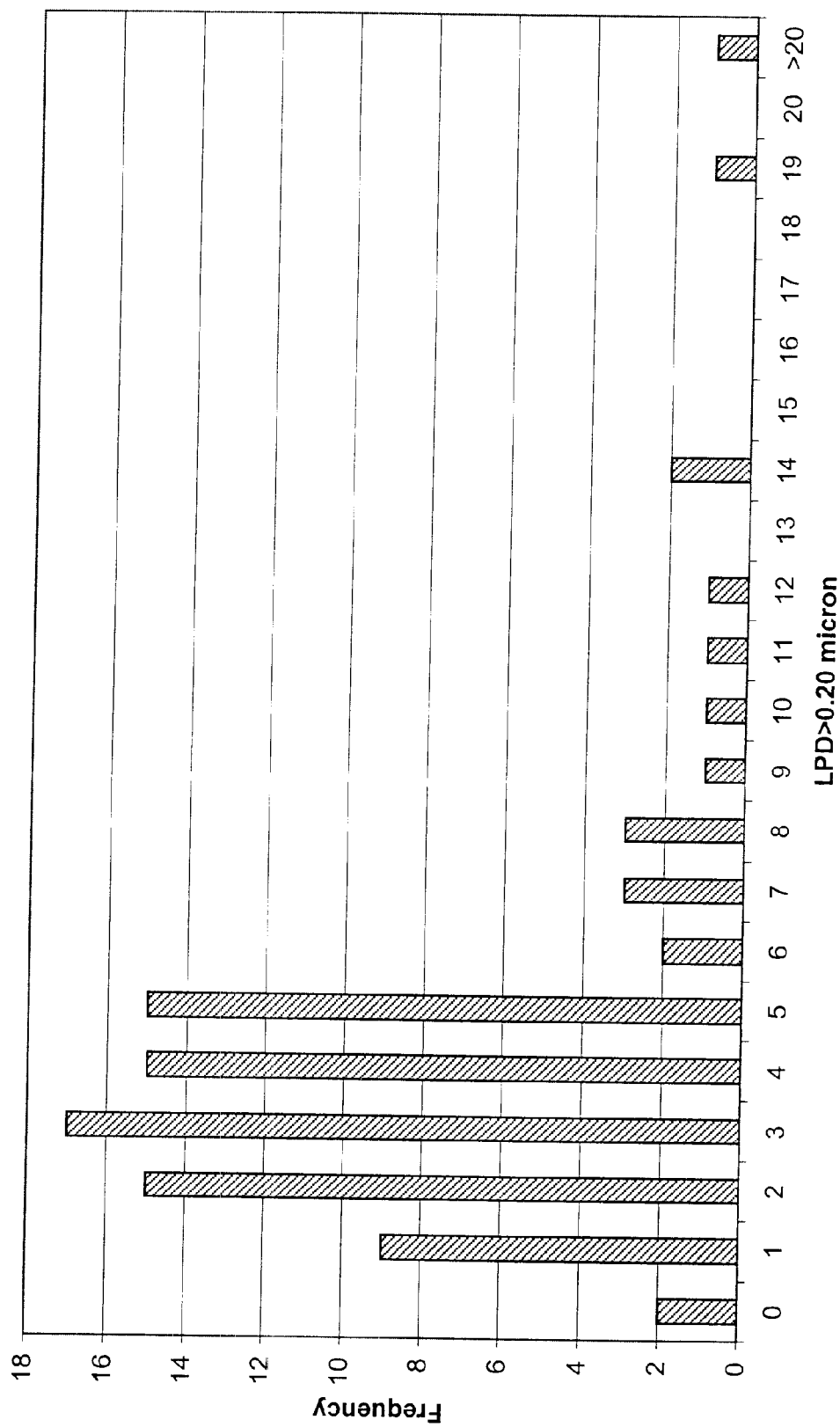
Figure 10D:
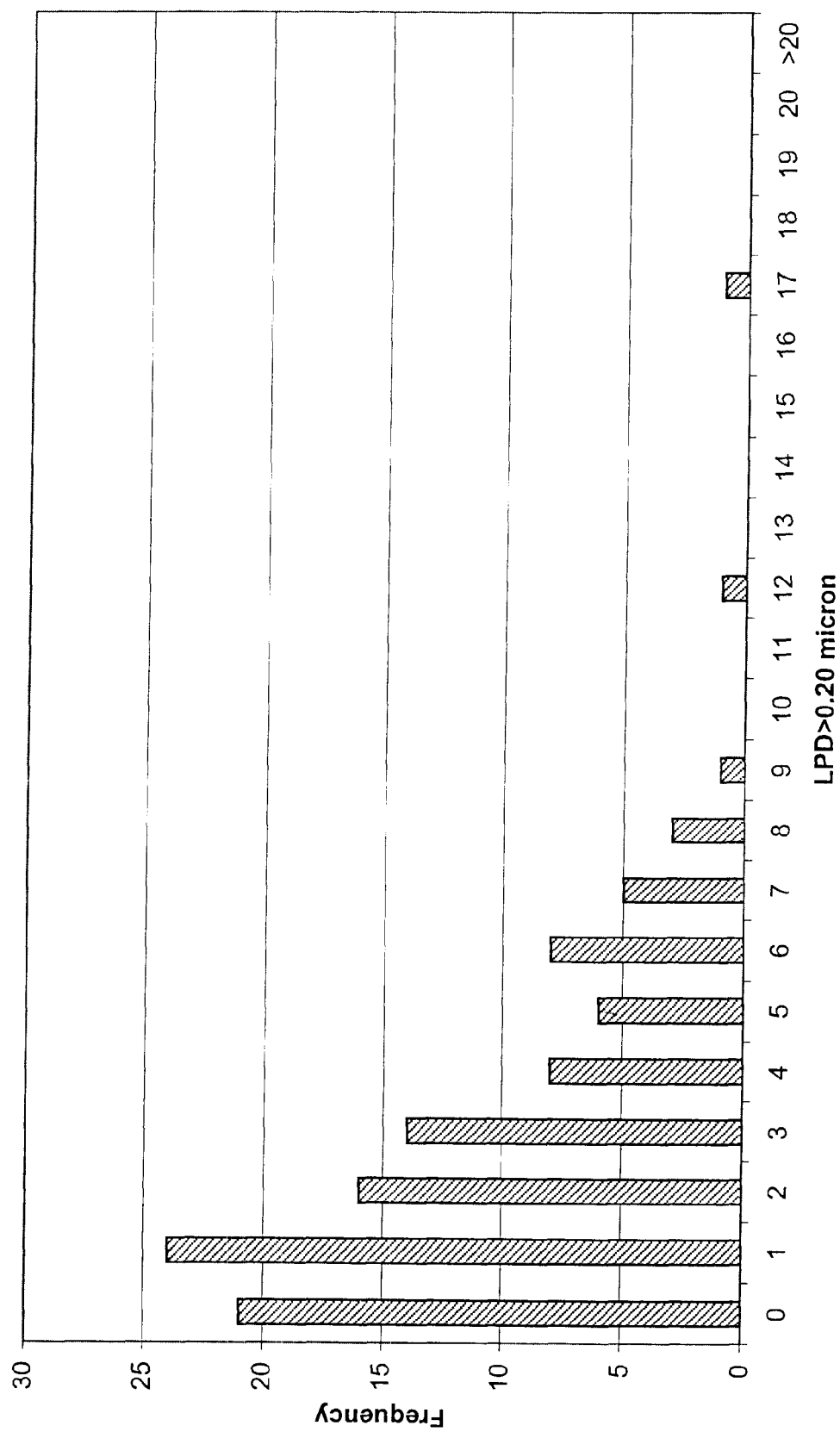
Figure 10E:
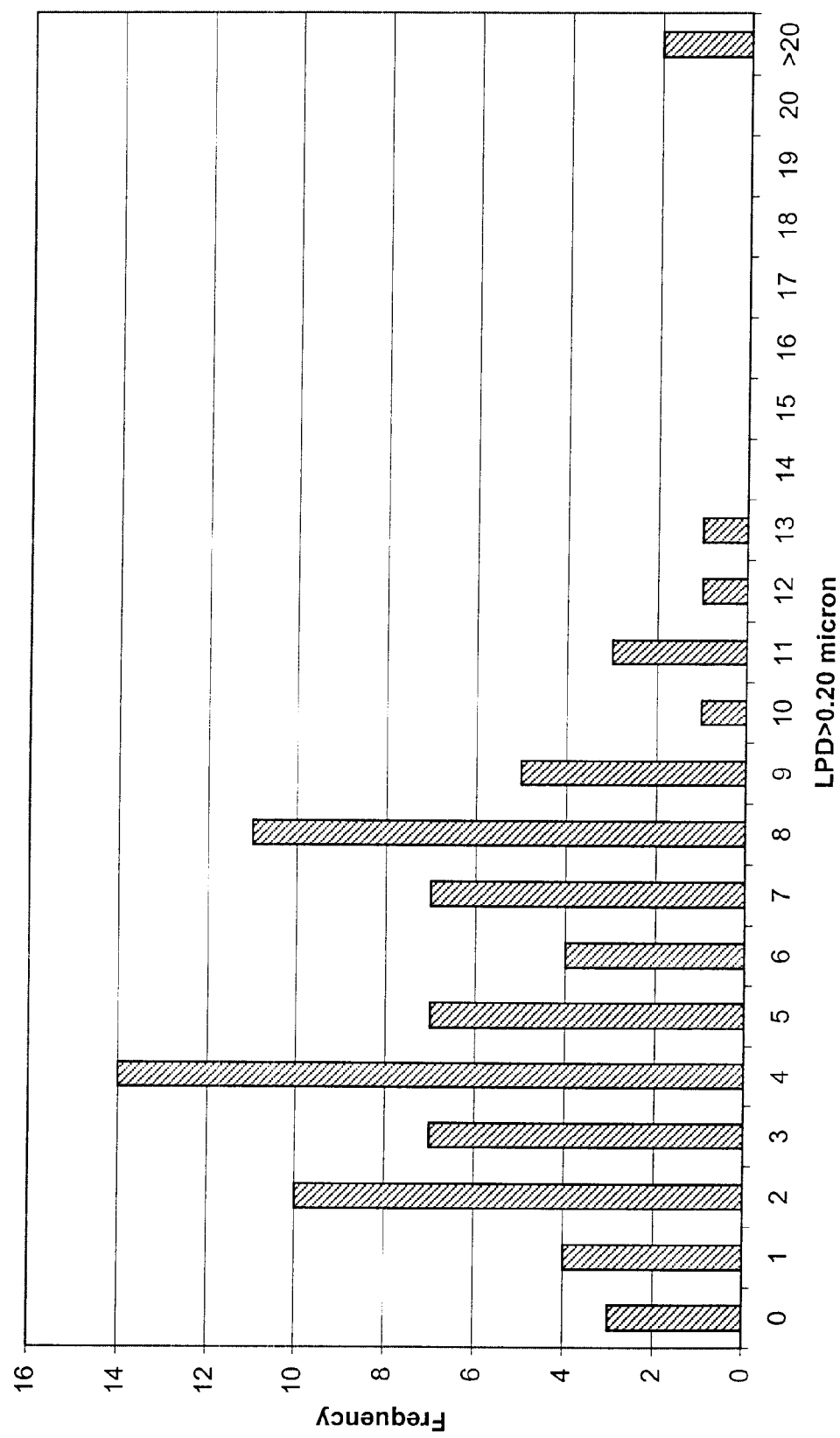

Referring now to FIG. 4, single crystal silicon ingots grown by this process exhibit a relatively uniform axial concentration of vacancy-type agglomerated defects, such as FPDs, particularly throughout the main body of the ingot. Such uniformity can, among other advantages, reduce the post-growth processing problems and expense encountered with nonuniform crystals. However, in addition to obtaining uniformity in defect distribution over the length of the ingot, it is also important to control the size and number of agglomerated defects formed. Accordingly, the present process will be optimized to also limit the number of light point defects in excess of about 0.2 microns in size while ensuring that an acceptable GOI value is obtained (i.e., a GOI value of at least about 50%, 60%, 70% or more). More specifically, by controlling the thermal history in the manner set forth above, the density and uniformity of large light point defects in the main body can be controlled, while also limiting the number of smaller defects, such as FPDs, which negatively impact GOI.

Typically, therefore, the present process enables a single crystal silicon ingot to be prepared having a relatively uniform density of FPDs over a substantial portion of the main body (i.e., about 70%, 80%, 90% or more), the density typically being less than about 150 defects/$cm^2$, preferably less than about 100 defects/$cm^2$, more preferably less than about 75 defects/$cm^2$, and most preferably less than about 50 defects/$cm^2$. Furthermore, the present process enables a silicon wafer to be obtained therefrom wherein the number of large LPDs (i.e., larger than about 0.2 microns) on the surface is less than about 20 defects/wafer, preferably less than about 15 defects/wafer, and more preferably less than about 15 defects/wafer. Accordingly, the present process enables wafers to be obtained which meet or exceed current requirements imposed by integrated circuit manufacturers.

It is to be noted in this regard that FPDs and LPDs are detected and measured by means common in the art. For example, for FPDs, a vacancy-rich wafer is typically immersed in a Secco etch solution for about 30 minutes and then visually inspected under a microscope to detect such defects. LPDs are typically detected and measured by reflecting laser light off of the surface of the wafer, by means of a Surfscan 6200 or a Tencor SP-1 instrument.

It is to be further noted that, in addition to LPD limits, manufacturers of integrated circuits also impose limits on the gate oxide integrity of silicon wafers, typically requiring each wafer to have a GOI of at least 50%, as determined by means standard in the art. Accordingly, by controlling the thermal history of the main body of the ingot in the manner set forth in this invention, silicon wafers may be obtained therefrom having a gate oxide integrity (GOI) of at least about 50%, preferably about 60%, more preferably about 70%, still more preferably about 80%, and most preferably about 85%. The present process is therefore advantageous because it provides the means by which to obtain silicon wafers which meet currently existing LPD and GOI requirements over substantially the entire usable length (i.e., at least about 70%, 80%, 90%, 95% or more) of the single crystal silicon ingot.

In addition to controlling heater power during growth of the main body of the ingot, it is also important to control heater power during growth if the end-cone. More specifically, while the side heater power remains substantially constant throughout the growth of both the main body and the end-cone, the power supplied to the bottom heater typically increases, once initiated, throughout the growth of the main body and the end-cone. As noted above, in some embodiments the power is increased along a quadratic curve, as exemplified in FIG. 3. Furthermore, it is to be noted that, during growth of the end-cone, the average power supplied to the bottom heater is typically at least about 110% of the average power supplied to the bottom heater during the growth of the main body, with average power levels of at least about 200%, 300%, or even 400% being more preferred.

It is to be noted, however, that even with these increases in bottom heater power during the growth process, in most circumstances the average power supplied to the bottom heater is only a minor portion of the total power supplied to the heating elements. More specifically, during the growth of the end-cone, the power supplied to the bottom heater is typically only between about 5% and about 15% of the average power supplied to the side heater during the growth of the end-cone.

With regard to the side heater power, as previously noted, preferably this remains essentially constant throughout the entire growth process (i.e., growth of both the main body as well as the end-cone). However, the power level may vary during growth of the end-cone, the average power supplied at times ranging between about 90% and about 110% of the average power supplied to the side heater during the growth of the main body.

In addition to controlling heater power and pull rate, the ingot and crucible rotation rates may be adjusted during growth of the main body and/or the end-cone. Typically, the ingot rotation rate and the crucible rotation rate during the growth of the main body are maintained between about 10 rpm to about 15 rpm and between about 5 rpm to about 10 rpm, respectively. During growth of the end-cone, one or both of these rotation rates are typically decreased, with the average values during end-cone growth being less than the respective average values during growth of the main body. For example, the ingot rotation rate during the growth of the end-cone is preferably less than about 10 rpm, while the crucible rotation rate during the growth of the end-cone is preferably less than about 6 rpm. More preferably, the rates of rotation for the ingot and crucible are ramped downward. Most preferably, the rates of rotation for the ingot and crucible are ramped downward from about 10 rpm to about 5 rpm, and from about 6 rpm to about 1 rpm, respectively.

The process of the present invention is particularly suited for improving gate oxide integrity, while limiting the number of LPDs in excess of about 0.2 microns, in silicon wafers obtained from single crystal silicon ingots prepared in a "slow cool" hot zone under growth conditions which cause silicon lattice vacancies to be the predominant intrinsic point defect over a substantial portion, and preferably the entire length, of the main body of the ingot. Generally speaking, single crystal silicon ingots may be grown to be "vacancy type" by controlling the ratio of $v/G_0$ such that the value of this ratio is greater than the critical value of $v/G_0$ (which, based on currently available information, appears to be about $2.1 \times 10^{-5}$ cm$^2$/sK, where $G_0$ is determined under conditions in which the axial temperature gradient is constant within the temperature range bound by the solidification temperature and a temperature greater than about 1300° C.). Control of the ratio of $v/G_0$ is discussed in detail in, for example PCT/US98/03686, PCT/US98/07365 and PCT/US98/07304, which are incorporated herein by reference.

As illustrated in the following Example, the process of the present invention may be used to more precisely regulate the thermal history of single crystal silicon ingots. By adjusting the distribution of power to the side heater and the bottom heater elements, the uniformity of the thermal history of the crystal is improved. The controlled distribution of power also improves the uniformity of the thermal history by allowing a more constant pull rate/growth rate of the crystal. As a result, a single crystal silicon ingot prepared in accordance with the present invention may be further processed, by means common in the art, to consistently yield single crystal silicon wafers over the length of the ingot which have improved gate oxide integrity and fewer light point defects.

The Example sets forth a particular see of conditions that may be used to achieve the desired result. However, it is to be noted that, depending upon such parameters as the nominal diameter of the ingot, hot zone design, crucible diameter and charge size, it may be desirable to change these conditions, adjusting for example the growth rate, the rates of rotation of the ingot and the crucible, as well as the power supplied to the heaters, at some point during the growth process. Accordingly, these conditions should not be viewed in a limiting sense.

EXAMPLE

In accordance with the present process, a number of single crystal silicon ingots were prepared according to the Czochralski method, grown under conditions to ensure vacancies were the predominant intrinsic point defect within the silicon (i.e., the ingots were vacancy-type). Specifically, each ingot was grown to have a nominal diameter of about 200 mm and a main body length of about 850 mm, each being pulled from a 22 inch diameter crucible containing a 100 Kg polysilicon charge. A Ferrofluidics crystal puller having a "slow cool" hot zone configuration was employed in all cases.

During growth of the main body, the pull rate ranged from about 0.6 to about 1 mm/minute (the rate being adjusted as necessary for purposes of, among other things, ensuring the silicon remained vacancy-type). The rate of rotation of the ingot was about 15 rpm, while the rotation rate of the crucible ranged from about 6 rpm to about 8 rpm. The power supplied to the side heater during the growth of the main body and the end-cone was substantially constant, typically ranging from about 120 kW to about 130 kW. Power to the bottom heater remained off until about half of the main body (i.e., about 400 mm) had been grown, at which point power supply was initiated and slowly increased along a quadratic curve to a final level of about 30 kW. More specifically, the power was increased from about 0 kW to about 10 kW over an axial position of about 400 mm to about 850 mm. As growth of the end-cone was initiated, crucible and/or ingot rotation rates were increased, or alternatively the growth rate, as needed in order to cause tapering to begin, and the power supply was increased from about 10 kW to a final value of about 30 kW.

For purposes of comparison, a number of single crystal silicon ingots similarly prepared (i.e., similar growth rates, ingot and crucible rotation rates, crystal puller/hot zone configurations, etc.), with the exception that bottom heating was not employed and side heater power was increased during the growth process. More specifically, the bottom heater remained off throughout the process, while the side heater power was gradually increased, after about half of the main body was grown, from about 120 kW to about 140 kW. Additionally, upon initiation of end-cone growth, the side heater power was increased from about 140 kW to about 160 kW.

Once grown, the main body of each ingot sliced into wafers by means common in the art, the wafers were then grouped according to which 20% segment of the main body from which they were obtained. The wafers were then analyzed, by means common in the art, for the presence of LPDs in excess of about 0.2 microns. The results for the process of the present invention are shown in FIGS. 10a through 10e, while the comparative results from those ingots grown without the use of constant side heater power/bottom heating are shown in FIGS. 9a through 9e. As discussed in detail above, it may be observed that when side heater power is increased, the number of LPDs in excess of about 0.2 microns in the latter portion of the ingot increases significantly.

In view of the above, it will be seen that the several objects of the invention are achieved. As various changes could be made in the above process conditions without departing from the scope of the invention, it is intended that all matter contained in the above description be interpreted as illustrative and not in a limiting sense.

What is claimed is:

1. A process for controlling the thermal history of a single crystal silicon ingot during growth, the silicon ingot being pulled from a silicon melt in accordance with the Czochralski method, the ingot having, in succession, a seed-cone, a main body, and an end-cone, the process comprising:

controlling (i) a growth velocity, v, and (ii) an average axial temperature gradient, $G_0$, during the growth of the main body of the ingot over the temperature range from solidification to a temperature of no less than about 1325° C., such that vacancies are the predominant intrinsic point defect in the main body; and, heating the silicon melt during growth of the main body with a side heater and a bottom heater, the side heater being maintained at a substantially constant power level during growth of the main body and end-cone.

2. The process of claim 1 wherein bottom heater power during growth of the main body is initiated after about 40% of the main body has been grown.

3. The process of claim 1 wherein bottom heater power during growth of the main body is initiated after about 50% of the main body has been grown.

4. The process of claim 1 wherein bottom heater power during growth of the main body is initiated after about 60% of the main body has been grown.

5. The process of claim 2, 3 or 4 wherein bottom heater power is increased, until growth of an end-cone is complete, by about 0.01 to about 0.05 kW/mm.

6. The process of claim 1 wherein the main body has an average axial temperature gradient of less than about 1° C./mm.

7. The process of claim 1 wherein the main body has an average axial temperature gradient of less than about 0.5° C./mm.

8. The process of claim 1 wherein at least about 75% of the main body of the ingot has a concentration of flow pattern defects which is less than about 100 defects/cm$^2$.

9. The process of claim 1 wherein at least about 85% of the main body of the ingot has a concentration of flow pattern defects which is less than about 100 defects/cm$^2$.

10. The process of claim 1 wherein side heater power is maintained between about 120 kW and about 130 kW during growth of the main body and end-cone.

11. The process of claim 10 wherein, once initiated, bottom heater power increases from about 0 kW to less than about 25 kW.

12. The process of claim 1 wherein a substantial portion of the main body of the ingot is allowed to reside between about 1000° C. and about 1100° C. for about 25 to about 100 minutes.

13. The process of claim 12 wherein a substantial portion of the main body of the ingot is allowed to reside between about 1000° C. and about 1100° C. for about 50 to about 75 minutes.

14. The process of claim 1 wherein a substantial portion of the main body of the silicon ingot is sliced to obtain silicon wafers having less than about 20 light point defects of a size less than about 0.2 microns.

15. The process of claim 14 wherein the wafers are obtained from at least about 85% of the main body of the ingot.

16. The process of claim 15 wherein the wafers are obtained from at least about 95% of the main body of the ingot.

17. The process of claim 14, 15 or 16 wherein the wafers have less than about 15 light point defects of a size less than about 0.2 microns.

18. The process of claim 14, 15 or 16 wherein the wafers have a gate oxide integrity of at least about 70%.

19. The process of claim 14, 15 or 16 wherein the wafers have a gate oxide integrity of at least about 80%.

20. A process for preparing a single crystal silicon ingot, from which may be obtained single crystal silicon wafers having gate oxide integrity values of at least about 50% and fewer than about 20 light point defects in excess of about 0.2 microns in size, single crystal silicon ingot being pulled from a silicon melt in accordance with the Czochralski method, the growth velocity, v, and an average axial temperature gradient, $G_0$, being controlled during growth over the temperature range from solidification to a temperature of no less than about 1325° C., such that vacancies are the predominant intrinsic point defect therein, the ingot having, in succession, a seed-cone, a main body, and an end-cone, the process being characterized in that, during growth of the main body and end-cone, side heater power remains substantially constant while heat is applied from below the silicon melt with a bottom heater in order to prevent the melt from re-solidifying.

21. The process of claim 20 wherein the wafers have a gate oxide integrity of at least about 70%.

22. The process of claim 20 wherein the wafers have a gate oxide integrity of at least about 80%.

23. The process of claim 21, 22 or 23 wherein the wafers have fewer than about 15 light point defects in excess of about 0.2 microns.

24. The process of claim 21, 22 or 23 wherein the wafers have fewer than about 10 light point defects in excess of about 0.2 microns.

25. The process of claim 20, 21 or 22 further characterized in that the wafers are obtained from at least about 85% of the main body of the ingot.

26. The process of claim 20, 21 or 22 further characterized in that the wafers are obtained from at least about 95% of the main body of the ingot.

* * * * *